(12) United States Patent
Han et al.

(10) Patent No.: US 11,757,068 B2
(45) Date of Patent: Sep. 12, 2023

(54) LIGHTING MODULE AND LIGHTING APPARATUS HAVING THEREOF

(71) Applicant: LG INNOTEK CO., LTD., Seoul (KR)

(72) Inventors: Sa Rum Han, Seoul (KR); Dong Il Eom, Seoul (KR); Young Hun Ryu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/180,390

(22) Filed: Feb. 19, 2021

(65) Prior Publication Data
US 2021/0175395 A1  Jun. 10, 2021

Related U.S. Application Data

(63) Continuation of application No. 16/138,734, filed on Sep. 21, 2018, now Pat. No. 10,957,825.

(30) Foreign Application Priority Data

Sep. 25, 2017 (KR) .................. 10-2017-0123558
Aug. 17, 2018 (KR) .................. 10-2018-0096012

(51) Int. Cl.
*H01L 33/50* (2010.01)
*H01L 33/56* (2010.01)
(Continued)

(52) U.S. Cl.
CPC .......... *H01L 33/502* (2013.01); *G02B 5/0205* (2013.01); *H01L 25/0753* (2013.01); *H01L 33/56* (2013.01); *H01L 33/507* (2013.01)

(58) Field of Classification Search
CPC ..... H01L 33/502; H01L 33/507; H01L 33/58; H01L 33/50–56; H01L 25/0753;
(Continued)

(56) References Cited

U.S. PATENT DOCUMENTS 6,066,861 A  5/2000 Höhn et al.
8,592,836 B2  11/2013 Yokotani et al.
(Continued)

FOREIGN PATENT DOCUMENTS

EP  2 469 613  6/2012
JP  2005-298805  10/2005
(Continued)

OTHER PUBLICATIONS

Korean Office Action dated Feb. 18, 2022 issued in KR Application No. 10-2018-0096012.
(Continued)

*Primary Examiner* — Natalia A Gondarenko
(74) *Attorney, Agent, or Firm* — KED & ASSOCIATES, LLP

(57) ABSTRACT

A lighting module according to an embodiment of the invention includes: a substrate; a plurality of light emitting devices disposed in N rows (N is an integer of 1 or more) on the substrate; a first resin layer covering the plurality of light emitting devices; a first diffusion layer disposed on the first resin layer and diffusing light emitted from the first resin layer; and a second diffusion layer disposed on the first diffusion layer and diffusing light emitted from the first diffusion layer, wherein the first diffusion layer includes a diffusing agent, and the second diffusion layer includes at least one of a phosphor and ink particles.

20 Claims, 19 Drawing Sheets
(2 of 19 Drawing Sheet(s) Filed in Color)

(51) Int. Cl.
*H01L 25/075* (2006.01)
*G02B 5/02* (2006.01)

(58) Field of Classification Search
CPC ....... H01L 2933/0033; H01L 2933/005; H01L 2933/0058; H01L 2933/0091; H01L 33/504; H01L 33/505; H01L 33/508; F21K 9/235; F21K 9/238; F21K 9/69; F21Y 2115/10; G02B 5/0205
USPC .... 257/72, 79, 98, 88, 99, E33.06, E33.061, 257/E33.074
See application file for complete search history.

(56) References Cited

U.S. PATENT DOCUMENTS

| | | | |
|---|---|---|---|
| 8,956,007 B2 | 2/2015 | Kondo et al. | |
| 9,333,905 B2 | 5/2016 | Nomura et al. | |
| 9,897,276 B2 | 2/2018 | Van De Ven et al. | |
| 9,929,328 B2 | 3/2018 | Park et al. | |
| 2008/0203901 A1 | 8/2008 | Bukesov et al. | |
| 2009/0286337 A1 | 11/2009 | Lee et al. | |
| 2010/0244662 A1* | 9/2010 | Uemoto | H01L 33/501 313/501 |
| 2011/0001148 A1 | 1/2011 | Sun et al. | |
| 2011/0317283 A1* | 12/2011 | Shim | G02B 1/041 252/586 |
| 2012/0138874 A1 | 6/2012 | Yuan et al. | |
| 2012/0153313 A1 | 6/2012 | Yokotani et al. | |
| 2013/0050979 A1 | 2/2013 | Van De Ven et al. | |
| 2013/0063939 A1 | 3/2013 | Kondo et al. | |
| 2013/0099661 A1 | 4/2013 | Gasse et al. | |
| 2014/0001506 A1 | 1/2014 | Park et al. | |
| 2014/0367711 A1 | 12/2014 | Bibl et al. | |
| 2014/0376233 A1 | 12/2014 | Park et al. | |
| 2015/0008463 A1* | 1/2015 | Yoshida | C09K 11/025 252/301.4 F |
| 2015/0036379 A1 | 2/2015 | Lee | |
| 2016/0126428 A1 | 5/2016 | Hosokawa et al. | |
| 2016/0215938 A1 | 7/2016 | Jacobson et al. | |
| 2016/0254420 A1 | 9/2016 | Denis | |
| 2016/0380164 A1 | 12/2016 | Anc | |
| 2017/0162553 A1 | 6/2017 | Bibl et al. | |
| 2019/0035987 A1* | 1/2019 | Yuasa | H01L 33/62 |
| 2019/0306946 A1 | 10/2019 | Yamakawa et al. | |

FOREIGN PATENT DOCUMENTS

| | | |
|---|---|---|
| JP | 2011-108889 | 6/2011 |
| JP | 2012-049333 | 3/2012 |
| JP | 2012-134305 | 7/2012 |
| JP | 2013-077811 | 4/2013 |
| JP | 2014-011159 | 1/2014 |
| JP | 2014-125597 | 7/2014 |
| JP | 2015-108677 | 6/2015 |
| JP | 2016-092401 | 5/2016 |
| KR | 10-2016-0083839 | 7/2016 |

OTHER PUBLICATIONS

Japanese Office Action dated Nov. 1, 2022 issued in Application No. 2018-175957.
European Search Report dated Nov. 28, 2018 issued in Application No. 18196434.7.
Korean Office Action dated Apr. 10, 2023 issued in Application No. 10-2022-0153927.
Japanese Office Action dated May 16, 2023 issued in Application No. 2018-175957.

* cited by examiner (a)          (b)

LIGHTING MODULE AND LIGHTING APPARATUS HAVING THEREOF

CROSS-REFERENCE TO RELATED APPLICATIONS

The present application is a Continuation of U.S. application Ser. No. 16/138,734, filed Sep. 21, 2018, which claims priority under 35 U.S.C. § 119(a) of Korean Patent Application No. 10-2017-0123558 filed on Sep. 25, 2017, and Application No. 10-2018-0096012 filed on Aug. 17, 2018, which are hereby incorporated by reference in their entirety.

BACKGROUND

1. Field of the Invention

Embodiments of the invention relate to a lighting module having a light emitting device.

Embodiments of the invention relate to a lighting module having a light emitting device and a plurality of resin layers.

Embodiments of the invention relate to a lighting module providing a surface light source.

Embodiments of the invention relate to a lighting unit or a vehicle lamp having a lighting module.

2. Discussion of Related Art

Conventional lighting applications include not only a vehicle lighting but also a backlight for a display and a signage.

A light emitting device, for example, a light emitting diode (LED) has advantages such as low power consumption, semi-permanent lifetime, fast response speed, safety, environmental friendliness compared to conventional light sources such as fluorescent lamps and incandescent lamps. Such an LED has been applied to various lighting apparatuses such as various display devices, indoor lights or outdoor lights, or the like.

Recently, a lamp employing an LED has been proposed as a vehicle light source. Compared to incandescent lamps, an LED has an advantage in low power consumption. However, since an emitting angle of light emitted from an LED is small, when the LED is used as a vehicle lamp, it is required to increase a light emitting area of a lamp using the LED.

Since a size of an LED is small, it is possible to increase a degree of freedom of design of a lamp, and the LED has economic efficiency due to the semi-permanent lifetime.

SUMMARY OF THE INVENTION

An embodiment of the invention may provide a lighting module providing a surface light source.

An embodiment of the invention may provide a lighting module in which a resin layer is disposed on a plurality of light emitting devices.

An embodiment of the invention may provide a lighting module in which a plurality of resin layers are disposed on a substrate and a light emitting device.

An embodiment of the invention may provide an lighting module in which a plurality of resin layers are disposed on light emitting devices that emit light through an upper surface and a plurality of side surfaces thereof.

An embodiment of the invention may provide a lighting module in which a plurality of resin layers are disposed on a substrate and a light emitting device, and a phosphor is included in at least one of the plurality of resin layers.

An embodiment of the invention may provide a lighting module in which a plurality of resin layers disposed on a substrate and a light emitting device and ink particles are included in at least one of the plurality of resin layers.

An embodiment of the invention may provide a lighting module in which a resin layer or a diffusion layer is disposed on a substrate and a light emitting device and having at least one or more of a phosphor, ink particles, and a diffusing agent.

An embodiment of the invention may provide a lighting module in which a plurality of resin layers are disposed on a substrate and a light emitting device, and a diffusing agent is included in a layer adjacent to the light emitting device among the plurality of resin layers.

An embodiment of the invention may provide a lighting module in which a resin layer with a phosphor is spaced apart from a substrate and a light emitting device.

An embodiment of the invention may provide a lighting module in which a resin layer with ink particles is spaced apart from a substrate and a light emitting device.

An embodiment of the invention may provide a lighting module in which a phosphor and ink particles are disposed in at least one of resin layers disposed on a light emitting device.

An embodiment of the invention may provide a lighting module in which ink particles are added to the uppermost layer among a plurality of resin layers disposed on light emitting devices.

An embodiment of the invention may provide a flexible lighting module having light emitting devices and a plurality of resin layers.

An embodiment of the invention may provide a lighting module in which light extraction efficiency and backlighting characteristics are improved.

An embodiment of the invention may provide a lighting module irradiating a surface light source and a lighting apparatus having the same.

An embodiment of the invention may provide a lighting unit, a liquid crystal display device, or a vehicle lamp having a lighting module.

A lighting module according to an embodiment of the invention comprises: a substrate; a plurality of light emitting devices disposed in N rows (N is an integer of 1 or more) on the substrate; a first resin layer covering the plurality of light emitting devices; a first diffusion layer disposed on the first resin layer and diffusing light emitted from the first resin layer; and a second diffusion layer disposed on the first diffusion layer and diffusing light emitted from the first diffusion layer, wherein the first diffusion layer includes a diffusing agent and the second diffusion layer includes a phosphor, and an interval between the plurality of light emitting devices is equal to or greater than a thickness of the first resin layer, and light emitted to the outside through the second diffusion layer may include light uniformity of 90% or more.

According to an embodiment of the invention, a straight distance between a lower surface of the substrate and an upper surface of the second diffusion layer may be 220% or less of the thickness of the first resin layer, a thickness of the first diffusion layer may be in the range of 40% to 80% of the thickness of the first resin layer, and a thickness of the second diffusion layer may be 25% or less of the thickness of the first diffusion layer.

According to an embodiment of the invention, a size of the diffusing agent may be greater than a wavelength of light emitted from the light emitting device, the size of the diffusing agent may be in the range of 4 μm to 6 μm, and a refractive index of the diffusing agent may be in the range of 1.4 to 2.0.

According to an embodiment of the invention, the phosphor may have a size in the range of 1 μm to 100 μm, and a content of the phosphor may include a range of 40 wt % to 60 wt % in a resin material of the second diffusion layer.

According to an embodiment of the invention, the first resin layer and the first diffusion layer may be formed of the same resin material, and the second diffusion layer may be formed of a resin material different from the first diffusion layer.

According to an embodiment of the invention, a refractive index of the second diffusion layer may be in the range of 1.45 to 1.6, the light emitting device may emit blue light, the second diffusion layer may emit red light, and a surface color of the second diffusion layer may include red-based color.

According to an embodiment of the invention, a content of the phosphor added to the second diffusion layer may be 5 times or higher than a content of the diffusing agent added to the first diffusion layer, and the second diffusion layer may include a side portion extending from an edge of an upper surface of the first diffusion layer toward the substrate.

A lighting module according to an embodiment of the invention comprises: a substrate; a plurality of light emitting devices on the substrate; a first resin layer for molding the plurality of light emitting devices; and a second resin layer comprising ink particles on the first resin layer, wherein at least one of the first resin layer and the second resin layer comprises a phosphor.

According to an embodiment of the invention, wherein a content of the ink particles is smaller than a content of the phosphor.

According to an embodiment of the invention, wherein the phosphor is disposed in the second resin layer, wherein a content of the phosphor in the second resin layer is in a range of 12 wt % to 23 wt %, and wherein a content of the ink particles in the second resin layer is in a range of 3 wt % to 13 wt %.

According to an embodiment of the invention, wherein the phosphor is disposed in the second resin layer and spaced apart from the light emitting devices, wherein a thickness of the second resin layer is thinner than a thickness of the first resin layer.

According to an embodiment of the invention, wherein the phosphor emits light having a longer wavelength than a wavelength of the light emitted from the light emitting device, and wherein the ink particles have a same color series as the phosphor.

According to an embodiment of the invention, wherein the wavelength emitted from the phosphor and the ink particle comprise a same red color, and wherein the light emitting device emits a wavelength in a range of 420 nm to 470 nm.

According to an embodiment of the invention, wherein a straight distance between a lower surface of the substrate and an upper surface of the second resin layer is 220% or less of the thickness of the first resin layer, wherein the thickness of the second resin layer comprises a range of 40% to 80% of the thickness of the first resin layer.

According to an embodiment of the invention, wherein the second resin layer comprises a side portions extending on a side surface of the first resin layer, and wherein the side portion of the second resin layer contacts the substrate and comprises the phosphor and the ink particles.

According to an embodiment of the invention, wherein the first resin layer comprises a diffusing agent, wherein the diffusing agent is in the range of 4 μm to 6 μm, and wherein the diffusing agent has a refractive index ranging from 1.4 to 2.

According to an embodiment of the invention, a light shielding portion disposed between the first and second resin layers and overlapped with the light emitting device in a vertical direction.

According to an embodiment of the invention, wherein a surface of the second resin layer is red, wherein a chroma value at a surface of the second resin layer is lower than a chroma value of light emitted through the second resin layer.

According to an embodiment of the invention, wherein the light emitting device comprises: a light transmitting substrate; a light emitting structure including a first conductivity type semiconductor layer, an active layer, and a second conductivity type semiconductor layer under the light transmitting substrate; a first electrode connected to the first conductivity type semiconductor layer under the light emitting structure; and a second electrode connected to the second conductivity type semiconductor layer under the light emitting structure, and wherein the first electrode and the second electrode of the light emitting device face the substrate and are electrically connected to the substrate.

A lighting module according to an embodiment of the invention comprises: a substrate; a plurality of light emitting devices disposed on the substrate in N rows (N is an integer of 1 or more); a first diffusion layer for diffusing light emitted from the light emitting device; a second diffusion layer for diffusing light emitted from the light emitting device; and a third diffusion layer for diffusing light emitted from the light emitting device, wherein the first diffusion layer comprises a diffusing agent, wherein the second diffusion layer comprises a phosphor, wherein the third diffusion layer includes at least one of a phosphor and ink particles, wherein an interval between the light emitting devices is equal to or greater than a thickness of each of the first diffusion layer, the second diffusion layer and the third diffusion layer, wherein the thickness of the first and second diffusion layers is smaller than the thickness of the first diffusion layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 35 is a view illustrating a comparison of a color tone of a reference example with color tones of surface colors of Examples 1 to 9 in a state in which a light emitting device is turned off in the lighting module according to the second embodiment.

FIG. 36 is a view illustrating a comparison of a color tone of a reference example with color tones of surface colors of Examples 1 to 9 in a state in which a light emitting device is turned on in the lighting module according to the second embodiment.

DETAILED DESCRIPTION OF THE EMBODIMENTS

Figure 1:
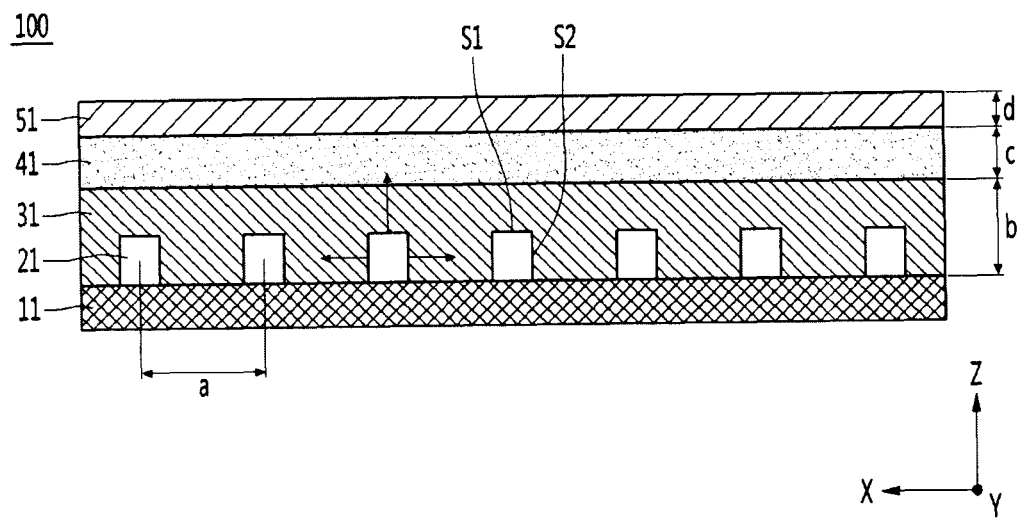
FIG. 1 is a side sectional view illustrating a lighting module according to a first embodiment of the invention.

Hereinafter, preferred embodiments of the invention will be described in detail with reference to the accompanying drawings.

However, the technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, can be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) can be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

A lighting apparatus according to the invention may be applied to various lamp devices requiring lighting, for example, a vehicle lamp, a home lighting apparatus, or an industrial lighting apparatus. For example, when a lighting apparatus is applied to a vehicle lamp, it may be applied to a head lamp, a side marker lamp, a side mirror lamp, a fog lamp, a tail lamp, a stop lamp, a daytime running light, a vehicle interior lighting, a door scarf, rear combination lamps, a backup lamp, and the like. A lighting apparatus of the invention may also be applied to indoor and outdoor advertisement devices, display devices, and various types of electric vehicles fields, and also may be applicable to all other lighting related fields and advertisement related fields that are currently being developed and commercialized or that may be realized by technological development in the future.

First Embodiment

Figure 2:
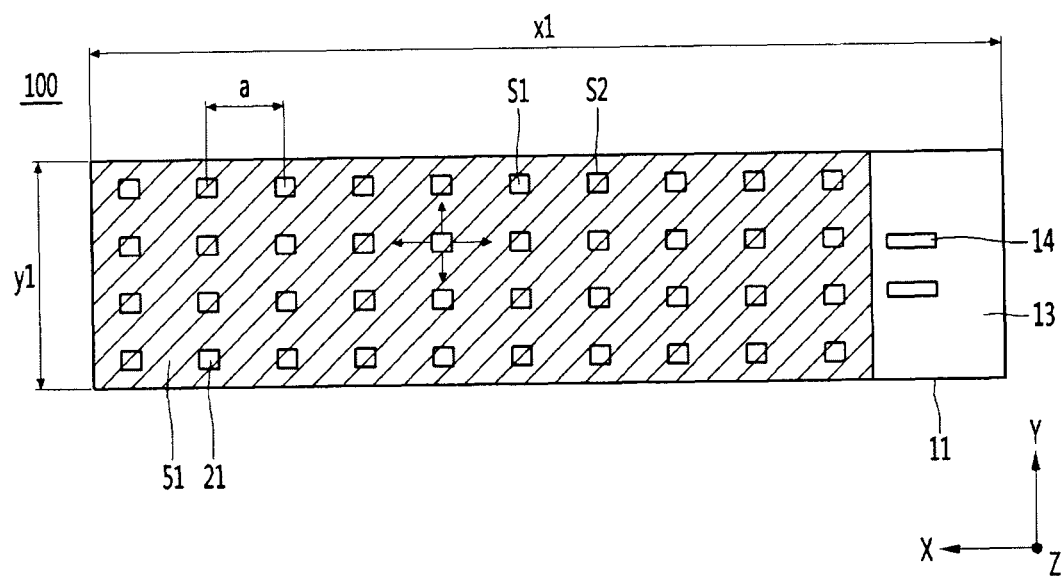
FIG. 2 is an example of a plan view of the lighting module of FIG. 1.

FIG. 1 is a side cross-sectional view illustrating a lighting module according to a first embodiment, and FIG. 2 is an example of a plan view of the lighting module of FIG. 1.

Referring to FIGS. 1 and 2, a lighting module 100 may include a substrate 11, a light emitting device 21 disposed on the substrate 11, a first resin layer 31 covering the light emitting device 21 on the substrate 11, and at least one or more of upper layers 41 and 51 on the first resin layer 31.

The lighting module 100 may emit light emitted from the light emitting device 21 to a surface light source. The lighting module 100 may include a reflection member disposed at an upper surface of the substrate 11. The reflection member may reflect light traveling to the upper surface of the substrate 11 to the first resin layer 31. The light emitting device 21 may be disposed on the substrate 11 in plural. In the lighting module 100, a plurality of light emitting devices 21 may be arranged in N columns (N is an integer of 1 or more) or/and M rows (M is an integer of 1 or more). The plurality of light emitting devices 21 may be arranged in the N columns and M rows (N and M are integers of 2 or more) as shown in FIG. 2. The lighting module 100 may be applied to various lamp devices requiring lighting, such as a vehicle lamp, a home lighting apparatus, or an industrial lighting apparatus. For example, when a lighting apparatus is applied to a vehicle lamp, it may be applied to a head lamp, a side marker lamp, a side mirror lamp, a fog lamp, a tail lamp, a turn signal lamp, a stop lamp, a daytime running light, vehicle interior light, a door scarf, rear combination lamps, a backup lamp, and the like.

As shown in FIGS. 1 and 2, the substrate 11 may function as a base member or a support member located at lower portions of the light emitting device 21 and the first resin layer 31.

The substrate 11 includes a printed circuit board (PCB). The substrate 11, for example, may include at least one of a resin-based printed circuit board (PCB), a metal core PCB, a flexible PCB, a ceramic PCB, and an FR-4 substrate. The substrate 11, for example, may include a flexible PCB or a rigid PCB. The upper surface of the substrate 11 has an X-axis and Y-axis plane, and a thickness of the substrate 11 may be a height in a Z direction orthogonal to X and Y directions. Here, the X direction may be a first direction, the Y direction may be a second direction orthogonal to the X direction, and the Z direction may be a third direction orthogonal to the X and Y directions. The substrate 11 may be a flexible material, and the upper surface or a lower surface of the substrate 11 may include a curved surface.

The substrate 11 may include a wiring layer (not shown) at an upper portion thereof, and the wiring layer may be electrically connected to the light emitting device 21. The reflection member or a protection layer disposed on the upper portion of the substrate 11 may protect the wiring layer. The plurality of light emitting devices 21 may be connected in series, in parallel, or in series-parallel by the wiring layer of the substrate 11. Groups having two or more of the plurality of light emitting devices 21 may be connected in series or in parallel, or the groups therebetween may be connected in series or in parallel.

As shown in FIG. 2, a length x1 in the X direction of the substrate 11 and a length y1 in the Y direction may be different from each other, and for example, the length x1 in the X direction may be disposed to be longer than the length y1 in the Y direction. The length x1 in the X direction may be disposed to be two times or more the length y1 in the Y direction. The thickness of the substrate 11 may be 0.5 mm or less, for example, in a range of 0.3 to 0.5 mm. Since the thickness of the substrate 11 is provided to be thin, a thickness of the lighting module may not be increased. Since the substrate 11 is provided with a thickness of 0.5 mm or less, a flexible module may be supported. The thickness of the substrate 11 may be 0.1 times or less, or may be in a range of 0.1 to 0.06 times a distance from the lower surface of the substrate 11 to the upper surface of the uppermost layer thereof. The distance from the lower surface of the substrate 11 to the upper surface of the uppermost layer 51 thereof may be a thickness of the lighting module.

The thickness of the lighting module 100 may be ⅓ or less of a shorter length of the lengths x1 and y1 in the X and Y directions of the substrate 11, but is not limited thereto. The thickness of the lighting module 100 may be 5.5 mm or less at a bottom of the substrate 11, in the range of 4.5 to 5.5 mm, or in the range of 4.5 to 5 mm. The thickness of the lighting module 100 may be a straight-line distance between the lower surface of the substrate 11 and upper surfaces of the upper layers 41 and 51. The thickness of the lighting module 100 may be 220% or less, for example, in a range of 180 to 220% of a thickness of the first resin layer 31. The thickness of the lighting module 100 may be a distance from the lower surface of the substrate to the upper surface of the uppermost layer thereof, and may be 2.2 times or less, for example, in the range of 1.8 to 2.2 times the thickness of the first resin layer 31. Since the lighting module 100 is provided with a thickness of 5.5 mm or less, it may be provided as a flexible and slim surface light source module.

When the thickness of the lighting module 100 is thinner than that of the above-described range, a light diffusion space may be reduced and hot spots may be generated, and when the thickness thereof is larger than that of the above-described range, spatial installation may be constrained and design freedom may be deteriorated due to an increase in module thickness. Since an embodiment provides a thickness of the lighting module 100 of 5.5 mm or less or 5 mm or less to provide a module with a curved structure, design freedom and spatial constraints may be reduced. A ratio of the length y1 in the Y direction of the lighting module 100 to the thickness of the lighting module 100 may be 1:m, a ratio relation may be m≤1, the m is a natural number of at least 1 or more, the rows of the light emitting devices 21 may be an integer smaller than m. For example, when the m is equal to or greater than four times the thickness of the lighting module 100, the light emitting device 21 may be arranged in four rows.

The substrate 11 may be provided with a connector 14 at a part thereof to supply power to the light emitting devices

21. In the substrate 11, a region 13 in which the connector 14 is disposed is a region in which the first resin layer is not formed and may be equal to or smaller than the length y1 of the substrate 11 in the Y direction. The connector 14 may be disposed at a part of the upper surface or the lower surface of the substrate 11. When the connector 14 is disposed at the lower surface of the substrate 11, the region may be removed. The top view shape of the substrate 11 may have a rectangular shape, a square shape, another polygonal shape, or a bar shape having a curved shape. The connector 14 may be a terminal connected to the light emitting device 21, a female connector, or a male connector.

The substrate 11 may include a protection layer or a reflection layer at the upper portion. The protection layer or the reflection layer may include a member having a solder resist material, and the solder resist material is a white material, and may reflect incident light.

As another example, the substrate 11 may include a transparent material. Since the substrate 11 of the transparent material is provided, the light emitted from the light emitting device 21 may be emitted in directions of the upper and lower surfaces of the substrate 11.

The light emitting device 21 is disposed on the substrate 11 and may be sealed by the first resin layer 31. The plurality of light emitting devices 21 may be in contact with the first resin layer 31. The first resin layer 31 may be disposed on a side surface and an upper surface of the light emitting device 21. The first resin layer 31 may protect the light emitting devices 21 and may be in contact with the upper surface of the substrate 11.

The light emitted from the light emitting device 21 may be emitted via the first resin layer 31. The light emitting device 21 has an upper surface S1 and a plurality of side surfaces S2, and the upper surface S1 faces the upper surfaces of the upper layers 41 and 51 and emits light toward the upper layers 41 and 51. The upper surface S1 is a light exit surface of the light emitting device 21, and most of light is emitted. The plurality of side surfaces S2 include at least four side surfaces, and light is emitted in a side direction of the light emitting device 21. The light emitting device 21 is an LED chip emitting at least five surfaces, and may be disposed on the substrate 11 in a flip chip type. The light emitting device 21 may have a thickness of 0.3 mm or less. As another example, the light emitting device 21 may be implemented as a horizontal chip or a vertical chip. In the case of the horizontal chip or the vertical chip, the light emitting device 21 may be connected to another chip or wiring pattern by a wire. When a wire is connected to the LED chip, a thickness of a diffusion layer may be increased due to a height of the wire, and an interval between the light emitting devices 21 may be increased due to a connection space according to a length of the wire. The light emitting device 21 according to an embodiment emits light with five surfaces, and a beam spread angle distribution may become large. The light emitting device 21 may be disposed on the substrate 11 as a flip chip. An interval a between the light emitting devices 21 may be equal to or greater than a thickness b (b≥a) of the first resin layer 31. The interval a may be 2.5 mm or more, for example, and may be varied depending on an LED chip size. A minimum interval between the light emitting devices 21 may be equal to or greater than an individual thickness of the first resin layer 31.

Since the light emitting device 21 disclosed in an embodiment is provided as a flip chip emitting at least five surfaces, the luminance distribution and the beam spread angle distribution of the light emitting device 21 may be improved.

Figure 33:
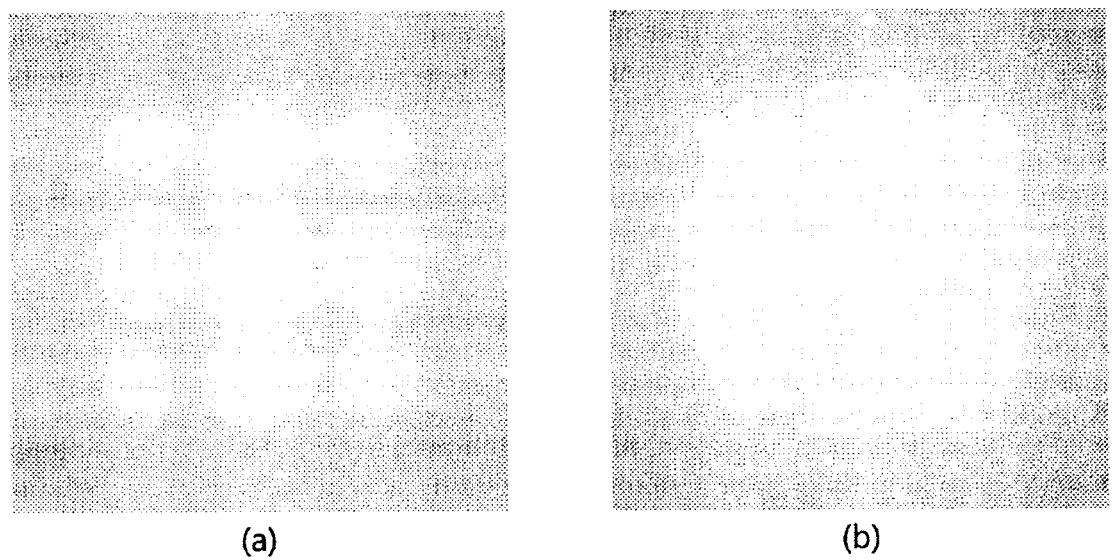
FIGS. 33(a) and (b) are views comparing luminance distributions of light emitting devices of Comparative Example and an embodiment.
Figure 34:
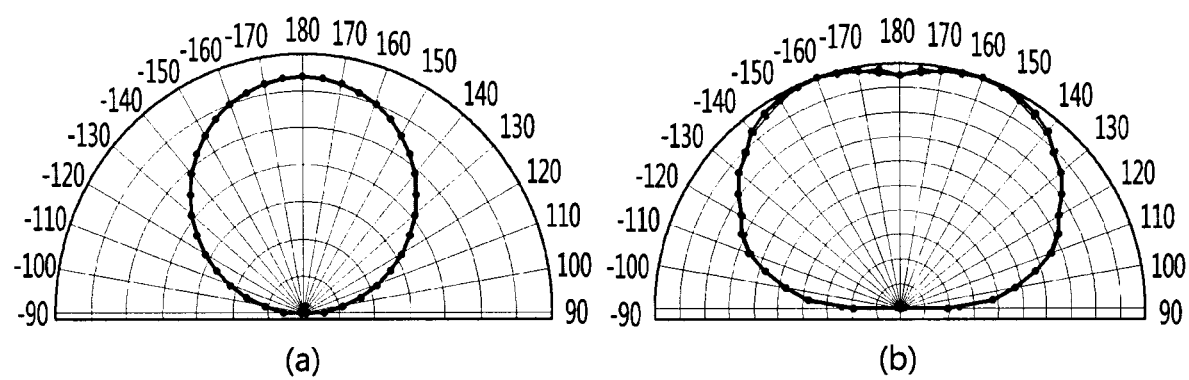
FIG. 34 is a view illustrating a beam pattern distribution of the light emitting devices of Comparative Example and the embodiment of FIG. 33.

As shown in FIG. 33, the luminance distribution of the light emitting device disclosed in an embodiment may have a uniform luminance distribution of a predetermined level or more in an entire region, as shown in (b) of FIG. 33. However, in the case of the vertical chip of Comparative Example, it can be seen that dark portions are generated in a region between the light emitting devices as shown in (a) of FIG. 33. It can be seen that even when the interval between the light emitting devices is further enlarged, the lighting module of an embodiment does not generate dark portions. In addition, as shown in FIG. 34, it can be seen that the beam spread angle distribution of the light emitting device of Comparative Example (a) is 120 degrees or less, and the beam spread angle distribution of the light emitting device of the embodiment (b) is 130 degrees or more. That is, the distribution of the beam spread angle is distributed more widely, so that the light diffusion effect may be given, the occurrence of dark portions may be reduced, and the interval between the light emitting devices may be increased.

When the light emitting devices 21 are arranged on the substrate 11 in an N×M matrix, N may be one column or two or more columns, and M may be one row or two or more rows. The N and M are integers of 1 or more. The light emitting devices 21 may be arranged in the Y-axis direction and the X-axis direction, respectively.

The light emitting device 21 is a light emitting diode (LED) chip capable of emitting at least one of blue, red, green, ultraviolet (UV), and infrared rays. The light emitting device 21 may emit at least one of blue, red, and green. The light emitting device 21 may be electrically connected to the substrate 11, but is not limited thereto.

The light emitting device 21 may be sealed with a transparent insulating layer or resin at a surface thereof, but is not limited thereto. The light emitting device 21 may include a phosphor layer having a phosphor at the surface.

The light emitting device 21 may include a support member having a ceramic support member or a metal plate at a lower portion thereof, and the support member may be used as an electrically conductive and heat conductive member.

The lighting module according to an embodiment may include a plurality of resin layers on the light emitting device 21 and the substrate 11. The plurality of resin layers may include, for example, two or more layers or three or more layers. The plurality of resin layers may optionally include at least two or more layers of a layer without an impurity, a layer to which a phosphor is added, a layer having a diffusing agent, and a layer to which a phosphor/diffusing agent is added. At least one of the plurality of resin layers may optionally include at least one of a diffusing agent, a phosphor, and ink particles. That is, the phosphor and the diffusing agent may be added to separate resin layers, or may be mixed with each other and disposed at one resin layer. The impurities may include a phosphor, a diffusing agent, or ink particles. The layers in which each of the phosphor and the diffusing agent are included may be disposed to be adjacent to each other or disposed to be spaced apart from each other. When the layers at which the phosphor and the diffusing agent are arranged are separated from each other, the layer at which the phosphor is disposed may be disposed above the layer at which the diffusing agent is disposed. The phosphor and the ink particles may be disposed at the same layer or at different layers from each other. For example, the layer to which the ink particles are added may be disposed more above the layer to which the phosphor is added.

Figure 29:
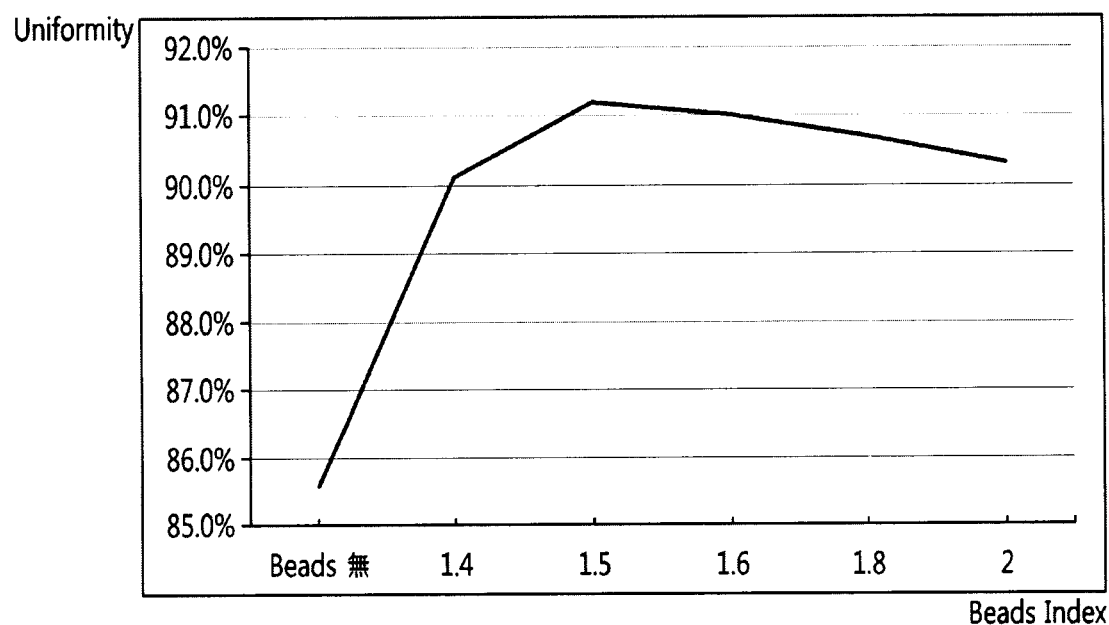
FIG. 29 is a graph illustrating light uniformity according to a refractive index of a diffusing agent added in a resin in a lighting module according to an embodiment of the invention.
Figure 30:
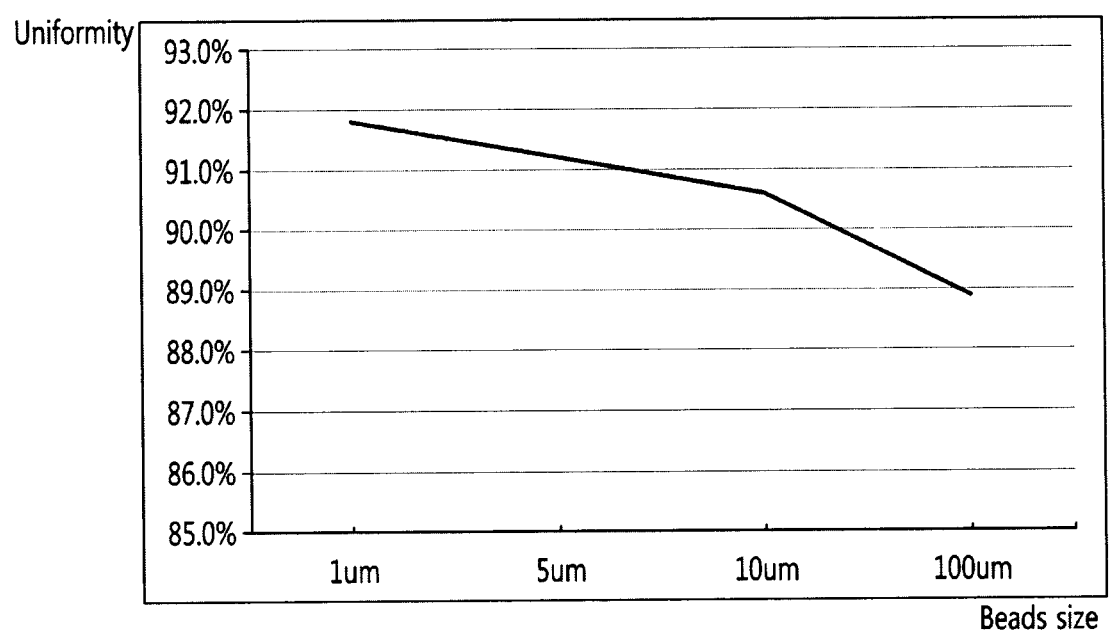
FIG. 30 is a graph illustrating light uniformity according to a size of a diffusing agent added in a resin in a lighting module according to an embodiment of the invention.

The phosphor may include at least one of a blue phosphor, a green phosphor, a red phosphor, an amber phosphor, and a yellow phosphor. A size of the phosphor may be in a range of 1 to 100 μm. For example, when the phosphor emits red light, the red wavelength may include a range of 625 to 740 nm. The light emitting device 21 may emit blue light in a range of 400 to 500 nm, for example, 420 to 470 nm. The higher the density of the phosphor is, the higher the wavelength-conversion efficiency may be, but the luminous intensity may be deteriorated. Therefore, the phosphor may be added in consideration of the light efficiency within the size. The diffusing agent may include at least one of polymethyl methacrylate (PMMA) series, $TiO_2$, $SiO_2$, $Al_2O_3$, and silicon series. The diffusing agent has a refractive index in a range of 1.4 to 2 at the light emission wavelength, and a size thereof may be in a range of 1 to 100 μm. The diffusing agent may be spherical, but is not limited thereto. As shown in FIG. 29, when the refractive index of the diffusing agent is 1.4 or more, the uniformity of light may be 90% or more. As shown in FIG. 30, when the size of the diffusing agent is in the range of 1 to 30 μm, the uniformity of light may be 90% or more. The light uniformity may be provided at 90% or more as the light uniformity on a region in which the light emitting devices are connected to each other.

The ink particles may include at least one of metal ink, UV ink, and curing ink. A size of the ink particles may be smaller than that of the phosphor. A surface color of the ink particles may be one of green, red, yellow, and blue. A type of the ink may be selectively applied among polyvinyl chloride (PVC) ink, polycarbonate (PC) ink, acrylonitrile butadiene styrene (ABS) copolymer ink, UV resin ink, epoxy ink, silicone ink, polypropylene (PP) ink, PMMA ink, and polystyrene (PS) ink. Here, a width or diameter of the ink particles may be in a range of 5 μm or less, for example, 0.05 to 1 μm. At least one of the ink particles may be smaller than the wavelength of light. The material of the ink particles may include at least one color of red, green, yellow, and blue. For example, the phosphor emits a red wavelength, and the ink particles may include red. For example, the red color tone of the ink particles may be darker than the color tone of the wavelength of the phosphor or light. The ink particles may be a different color from the color of the light emitted from the light emitting device. The ink particles may give an effect of shielding or blocking incident light.

The resin layer may include a resin or may include a resin-based material. The plurality of resin layers may have the same refraction index, at least two layers may have the same refraction index, or the refractive index of the layer adjacent to an uppermost layer may be gradually lower or higher.

Referring to FIG. 1, the lighting module 100 may include at least one upper layer on the first resin layer 31. The upper layer may include a first diffusion layer 41 disposed on the first resin layer 31 and a second diffusion layer 51 disposed on the first diffusion layer 41. The first and second diffusion layers 41 and 51 may be a resin layer disposed at an upper portion of the first resin layer 31. Alternatively, the first diffusion layer 41 may be defined as a second resin layer disposed on the first resin layer, and the second diffusion layer 51 may be defined as a third resin layer disposed on the second resin layer.

The first resin layer 31 is disposed on the substrate 11 to seal the light emitting device 21. The first resin layer 31 may be thicker than the light emitting device 21. The first resin layer 31 may be a resin material such as a transparent resin material, for example, an ultraviolet (UV) resin, silicone or epoxy. The first resin layer 31 may be a layer without a diffusing agent or a transparent molding layer.

The thickness b of the first resin layer 31 may be greater than that of the substrate 11. The thickness b of the first resin layer 31 may be in a range of 5 times or more, for example, 5 to 9 times the thickness of the substrate 11. The first resin layer 31 may be arranged in the thickness, so that the light emitting device 21 may be sealed on the substrate 11 to prevent moisture penetration, and the substrate 11 may be supported. The first resin layer 31 and the substrate 11 may be a flexible plate. The thickness b of the first resin layer 31 may be in a range of 2.7 mm or less, for example, 2 to 2.7 mm. When the thickness b of the first resin layer 31 is smaller than the range, the interval between the light emitting device 21 and the first diffusion layer 41 may be reduced or the thickness of the layer for diffusion may be increased, and when the thickness b of the first resin layer 31 is larger than the range, the thickness of the module may be increased or luminous intensity may be deteriorated.

The first resin layer 31 is disposed between the substrate 11 and the first diffusion layer 41 and guide the light emitted from the light emitting device 21 to be emitted to the first diffusion layer 41. The first resin layer 31 may be a layer of a transparent material to which no impurities are added. Since the first resin layer has no impurities, the light may be transmitted with straightness.

The light emitted from the light emitting device 21 is emitted via the upper surface S1 and the side surface S2, and the light emitted via the upper surface S1 and the side surface S2 may be propagated via the first resin layer 31. The light emitted through the side surface S2 or reflected in the first and second diffusion layers 41 and 51 may be reflected again at the upper surface of the substrate 11. The light emitting device 21 may emit, for example, blue light in a range of 420 to 470 nm.

The first diffusion layer 41 may be contacted on the first resin layer 31. The first diffusion layer 41 may be formed of a resin material having a diffusing agent after the first resin layer 31 is cured, and then cured. Here, the diffusing agent may be added in a range of 1.5 to 2.5 wt % based on the amount of the first diffusion layer 41 in the process. The first diffusion layer 41 may be a transparent resin material, for example, an ultraviolet (UV) resin, epoxy or silicone. The refractive index of the first diffusion layer 41 may be 1.8 or less, for example, 1.1 to 1.8, or 1.4 to 1.6, and may be lower than the refractive index of the diffusing agent.

The UV resin, for example, may use as a main material a resin (oligomer type) having urethane acrylate oligomer as a main raw material. For example, urethane acrylate oligomer, which is a synthetic oligomer, may be used. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photoinitiator to be able to perform a function of initiating photoreactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

Figure 27:
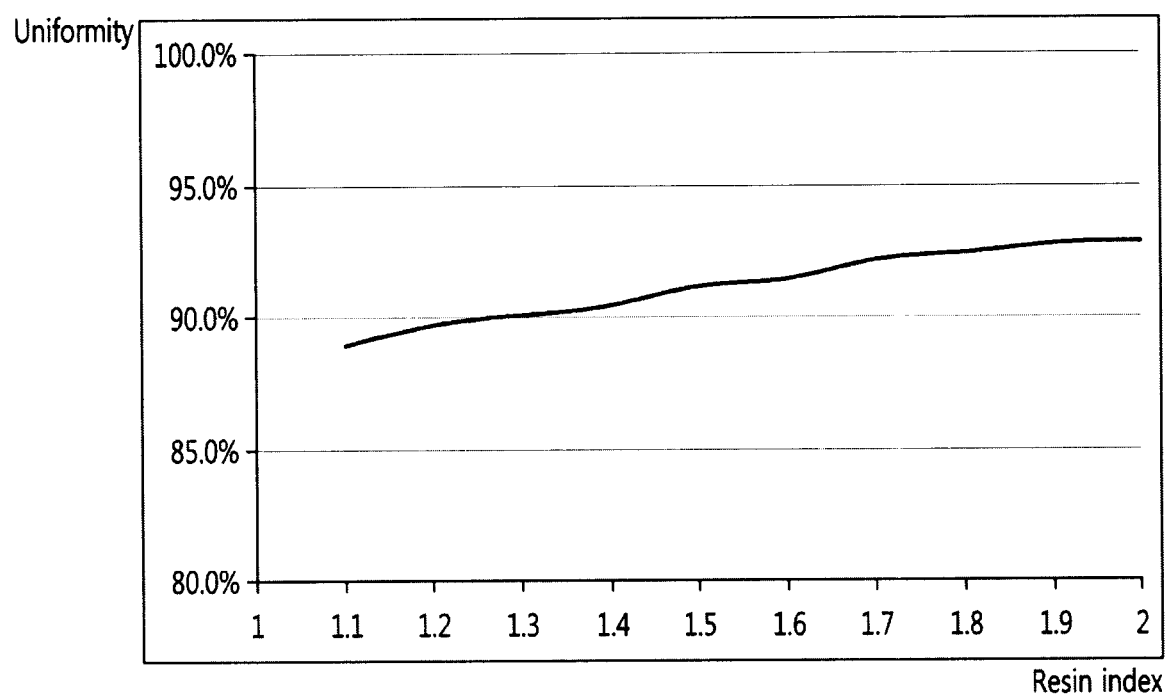
FIG. 27 is a graph illustrating light uniformity according to a refractive index of a resin in a lighting module according to an embodiment of the invention.
Figure 28:
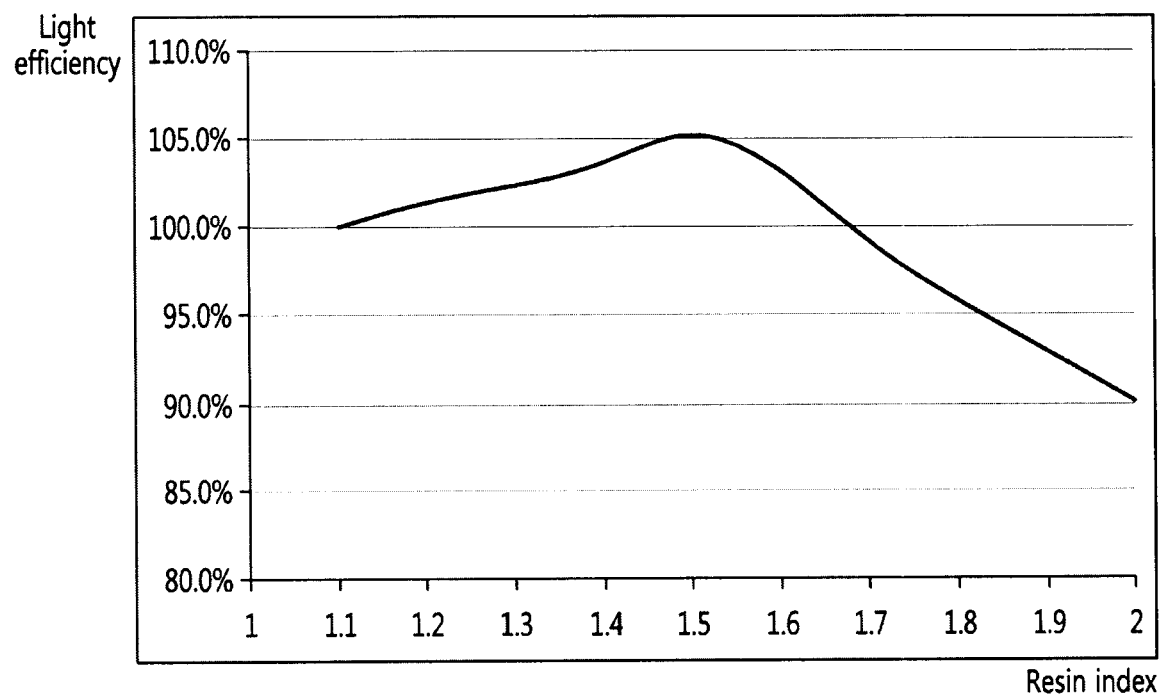
FIG. 28 is a graph illustrating light efficiency according to a refractive index of a resin in a lighting module according to an embodiment of the invention.

The first resin layer 31 and the first diffusion layer 41 may be formed of the same resin material. When the first resin layer 31 and the first diffusion layer 41 are the same resin material, the first resin layer 31 and the first diffusion layer 41 are in close contact with each other and light loss at an interface between the first resin layer 31 and the first diffusion layer 41 may be reduced. As shown in FIG. 27, when the refractive index of the resin material of the first resin layer 31 and the first diffusion layer 41 is 1.4 or more at the light emission wavelength, it can be seen that the uniformity of light is 90% or more. The refractive index of such a resin material may be in a range of 1.8 or less, for example, 1.1 to 1.8, or 1.4 to 1.6, and may be lower than the refractive index of the diffusing agent. As shown in FIG. 28, when the refractive index of the resin material of the first resin layer 31 and the first diffusion layer 41 is in the range of 1.1 to 1.8, it can be seen that the light efficiency is 95% or more.

The first diffusion layer 41 may have a thickness (c, b>c) that is thinner than the thickness b of the first resin layer 31. The thickness c of the first diffusion layer 41 may be 80% or less, for example, 40 to 80% of the thickness b of the first resin layer 31. Since the first diffusion layer 41 is provided in a thin thickness, ductility characteristics of the lighting module may be secured.

The first diffusion layer 41 may include a diffusing agent (beads or a dispersing agent). The first diffusion layer 41 may be disposed between the first resin layer 31 and the second diffusion layer 51. The diffusing agent (beads or a dispersing agent) has a refractive index in a range of 1.4 to 2 at the light emission wavelength, and a size thereof may be in a range of 4 to 6 μm. The diffusing agent may be spherical, but is not limited thereto. As shown in FIG. 29, when the refractive index of the diffusing agent is 1.4 or more, for example, 1.4 to 2, the uniformity of light may be 90% or more. As shown in FIG. 30, when the size of the diffusing agent is in the range of 4 to 6 μm, the uniformity of light may be 90% or more.

The diffusing agent of the first diffusion layer 41 may diffuse light incident via the first resin layer 31. Therefore, generation of hot spots due to light emitted via the first diffusion layer 41 may be reduced. The diffusing agent may have a size larger than the wavelength of the light emitted from the light emitting device 21. Since the diffusing agent is disposed with a size larger than the wavelength, the light diffusion effect may be improved.

A content of the diffusing agent may be in a range of 5 wt % or less, for example, 2 to 5 wt % in the first diffusion layer 41. When the content of the diffusing agent is smaller than the range, there is a limit to lowering hot spots. When the content is larger than the range, light transmittance may be deteriorated. Therefore, the diffusing agent is disposed in the first diffusion layer 41 in the above-described content, and thus light may be diffused to reduce hot spots without deteriorating the light transmittance.

The second diffusion layer 51 may be formed of a different material from the resin material of the first resin layer 31 and the first diffusion layer 41. The second diffusion layer 51 may be a transparent layer, and may include a phosphor therein. The second diffusion layer 51 may include at least one of one or more types of phosphors such as a red phosphor, an amber phosphor or a yellow phosphor. The wavelength-conversion efficiency of the diffused light may be increased by adding a phosphor in the second diffusion layer 51. The second diffusion layer 51 may include a material such as silicone or epoxy. The refractive index of the second diffusion layer 51 may be in a range from 1.45 to 1.6. The refractive index of the second diffusion layer 51 may be equal to or higher than that of the diffusing agent. The refractive index of the second diffusion layer 51 may be higher than that of the first resin layer 31 and the first diffusion layer 41. When the refractive index of the second diffusion layer 51 is lower than the range, the uniformity of light is lowered, and when the refractive index is higher than the range, the light transmittance may be deteriorated. Accordingly, the refractive index of the second diffusion layer 51 may be provided in the range to adjust the light transmittance and the light uniformity. The second diffusion layer 51 may be defined as a layer for diffusing light having a phosphor therein. The surface color of the second diffusion layer 51 may be a red color series or the same series as the phosphor. The surface color of the second diffusion layer 51 indicates a color tone in a state in which the light emitting device is turned off. As another example, the surface color of the second diffusion layer 51 may be a different color from the phosphor.

Figure 31:
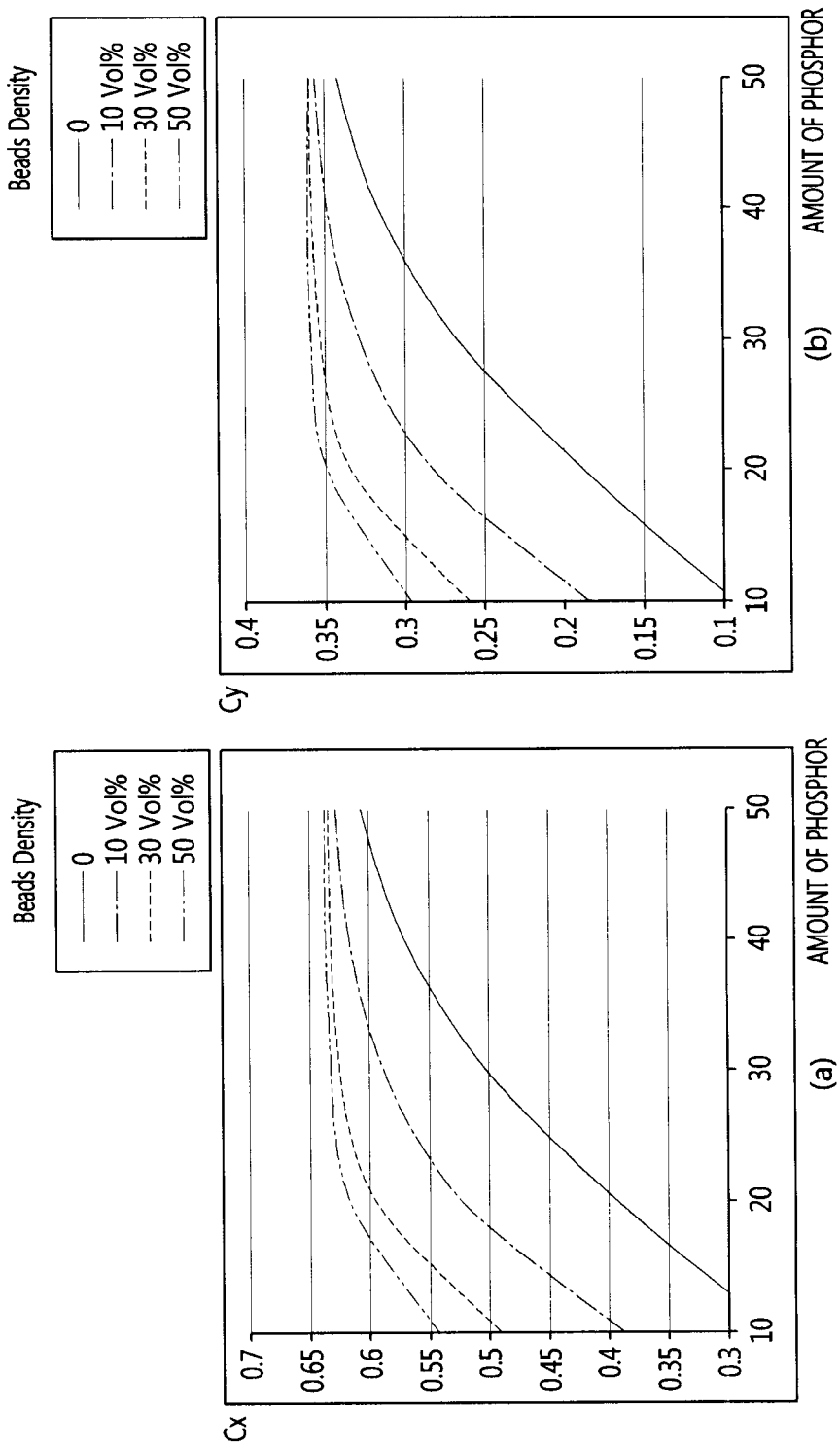
FIGS. 31(a) and 31(b) are graphs illustrating changes in chromaticity depending on the density of a diffusing agent added in a resin and an amount of a phosphor in a lighting module according to an embodiment of the invention.

A content of the phosphor may be added in the same amount as the resin material constituting the second diffusion layer 51. A ratio of the phosphor to the resin material of the second diffusion layer 51 may be 40% to 60% relative to 60% to 40%. For example, the resin material of the third phosphor and the second diffusion layer 51 may be added in the same ratio, for example, may be mixed at 50% to 50%. As another example, a content of the phosphor may be in a range of 40 to 60 wt %, and a content of the resin material of the second diffusion layer 51 may be in a range of 40 to 60 wt %. The content of the phosphor may have a difference of 20% or less or 10% or less from the ratio to the resin material of the second diffusion layer 51. Here, as shown in (a) and (b) of FIG. 31, the amount of phosphor required for color coordinates Cx and Cy decreases as the density of the diffusing agent (beads) added to the first diffusion layer increases. Accordingly, it can be seen that the amount of phosphor is adjusted according to the degree of diffusion of light by the diffusing agent.

In the embodiment, the content of the phosphor in the second diffusion layer 51 is added at 40 wt % or more, or 40 to 60 wt %, so that the color tone at a surface of the second diffusion layer 51 may be provided with the color tone of the phosphor, and thus the diffusion and wavelength-conversion efficiency of light can be improved. In addition, it is possible to reduce the transmission of the wavelength, for example, the blue light, of the light emitted from the light emitting device 21 via the second diffusion layer 51. Further, the light extracted via the second diffusion layer 51 may be provided as a surface light source by the wavelength of the phosphor. For example, when the phosphor emits red light, the red wavelength may include a range of 625 to 740 nm.

The second diffusion layer 51 may be provided in the form of a film, for example, by adding a phosphor in a resin material and curing the phosphor. The second diffusion layer 51 may be directly formed on the first diffusion layer 41, or separately formed and then bonded. The second diffusion layer 51 formed in the film form may be adhered to an upper surface of the first diffusion layer 41. An adhesive may be disposed between the second diffusion layer 51 and the first diffusion layer 41.

The adhesive may be, as a transparent material, an adhesive such as UV adhesive, silicone or epoxy. The second diffusion layer 51 may be provided in the form of a film, so that it is possible to uniformly provide the phosphor distribution therein and to provide the color tone of the surface color at a predetermined level or more.

A resin material film may be used as the second diffusion layer 51, so that a module with high ductility may be provided, as compared with the case of using a polyester (PET) film. The second diffusion layer 51 may be a protection film having a phosphor or a release film having a phosphor. The second diffusion layer 51 may be provided as a film attachable to or detachable from the first diffusion layer 41.

The second diffusion layer 51 may have a thickness (d, d<c<b) smaller than the thickness c of the first diffusion layer 41 and for example, may be in a range from 0.3 to 0.5 mm. The thickness d of the second diffusion layer 51 may be in a range of 25% or less, for example, 16% to 25% of the thickness c of the first diffusion layer 41. The thickness d of the second diffusion layer 51 may be in a range of 18% or less, for example, 14% to 18% of the thickness b of the first resin layer 31. When the thickness d of the second diffusion layer 51 is larger than the range, the light extraction efficiency may be decreased or the module thickness may be increased, and when the thickness d of the second diffusion layer 51 is smaller than the range, the suppressing of hot spots may be difficult, or the wavelength-conversion efficiency may be lowered. Furthermore, the second diffusion layer 51 is a layer for wavelength conversion and external protection, and when the second diffusion layer 51 is thicker than the range, the ductility characteristics of the module may be deteriorated and the degree of design freedom may be lowered.

The phosphor converts the light emitted from the light emitting device 21 to a wavelength. The phosphor may emit light having a longer wavelength than that of the light emitted from the light emitting device 21. When the phosphor is a red phosphor, an incident light is converted into red light. Most of the light emitted from the light emitting device 21 may be wavelength-converted. The light is uniformly diffused via the diffusing agent added to the first diffusion layer 41 and the diffused light may be wavelength-converted by the phosphor added to the second diffusion layer 51. As another example, the phosphor may include for example, at least one or two or more of an amber phosphor, a yellow phosphor, a green phosphor, a red phosphor, and a blue phosphor.

Since the second diffusion layer 51 includes a phosphor, the appearance color may be shown as the color of the phosphor. For example, when the phosphor is red, the surface color of the second diffusion layer 51 may be seen in red. The surface of the second diffusion layer 51 or the surface of the lighting module may be provided as a red image when the light emitting device 21 is turned off, and when the light emitting device 21 is turned on, red light having a certain luminous intensity may be diffused and provided as a red image of the surface light source. The color coordinates of the surface color may have different values within the color of the phosphor depending on whether the light emitting device 21 is turned on or off.

The lighting module 100 according to an embodiment may have a thickness of 5.5 mm or less, may emit a surface light source via an upper surface and may have ductility characteristics. The lighting module 100 may emit light via a side surface.

An embodiment may provide a flexible lighting module having a plurality of resin layers, for example, a first resin layer 31, and diffusion layers 41 and 51, on a substrate 11. The lighting module of an embodiment allows light to be guided in a radial or straight direction in the first resin layer 31 to diffuse, to be diffused via the diffusing agent of the first diffusion layer 41, and to be wavelength-converted and diffused via the phosphor of the second diffusion layer 51. Accordingly, the light to be finally emitted via the lighting module is emitted as a surface light source. In addition, the plurality of light emitting devices 21 in the lighting module 100 may emit light at five surfaces thereof on a flexible substrate in a flip manner, and the light emitted via the upper and side surfaces of the light emitting device 21 may be emitted in a direction of the first and second diffusion layers 41 and 51 and in a direction of a side of the first resin layer 31. The light emitted from the light emitting device 21 may emit light in directions of an upper surface and all side surfaces of the lighting module. The above-described lighting module may be applied to a lamp of a vehicle, a display device having a micro LED, or various lighting apparatuses. The first resin layer 31 may have a polygonal shape or a curved shape.

The above-described lighting module has a surface color and provides a surface light source, so that an additional inner lens may be removed, and an air gap on the light emitting device 21 or a structure for inserting the light emitting device 21 may be removed by sealing the light emitting devices 21 with the first resin layer 31.

The lighting module 100 may be provided in a flat plate shape, a convex curved shape, a concave curved shape, or a convex-concave shape when viewed from the side. The lighting module may be a bar shape like a stripe, a polygonal shape, a circular shape, an elliptical shape, a shape having a convex side surface, or a shape having a concave side surface when viewed from the top view.

FIGS. 3 to 13 are modified examples of the diffusion layer or another structure in the lighting module of the invention, and the same configuration as the above-described configuration is referred to the above description, and may be selectively applied to the modified example or another example.

Figure 3:
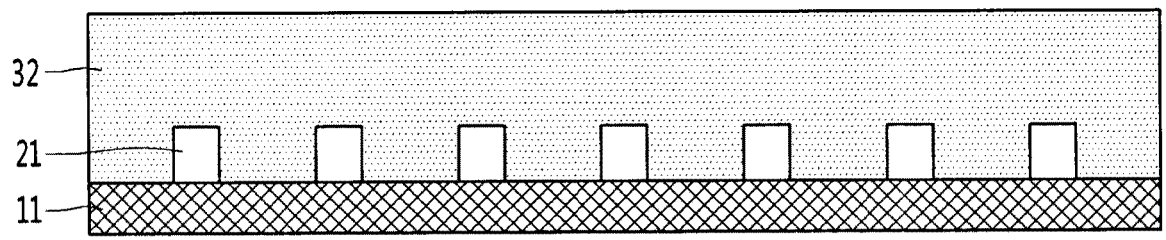
FIG. 3 is a view illustrating a first modified example of the lighting module of FIG. 1.

FIG. 3 is a first modified example of the lighting module of FIG. 1.

Referring to FIG. 3, a plurality of light emitting devices 21 may be disposed on a substrate 11, and a first resin layer 32 may be disposed on the plurality of light emitting devices 21. The lighting module is a configuration in which two layers are removed from the lighting module described in FIG. 1.

The first resin layer 32 may include a phosphor and a diffusing agent. The phosphor may include at least one of a red phosphor, an amber phosphor, a yellow phosphor, a green phosphor, and a white phosphor. The first resin layer 32 may be defined as a diffusion layer or a resin layer. The first resin layer 32 may be formed of the same material as that of the first resin layer disclosed in FIG. 1.

A content of the diffusing agent added to the first resin layer 32 may be in a range of 5 wt % or less, for example, 2 to 5 wt %. When the content of the diffusing agent is smaller than the range, there is a limit to lowering hot spots. When the content is larger than the range, the light transmittance may be deteriorated. Therefore, the diffusing agent is disposed in the first resin layer 32 in the above-described content, and thus light may be diffused to reduce hot spots without deteriorating the light transmittance.

The phosphor added in the first resin layer 32 may have a difference in content with the resin material of the first resin layer 32 by 25% or less or 15% or less. The content of the phosphor may be added to the first resin layer 32 in the range of 35 wt % or more, or 35 to 45 wt %. The content of the phosphor in the first resin layer 32 may be 5 times or more than a content the diffusing agent. Accordingly, the color at a surface of the first resin layer 32 may be provided with the color tone of the phosphor, and the diffusion and wavelength-conversion efficiency of light may be improved. In addition, it is possible to reduce the transmission of the wavelength, for example, the blue light, of light emitted from the light emitting device 21 via the first resin layer 32. Further, the light extracted via the first resin layer 32 may be provided as a surface light source by the wavelength of the phosphor. A thickness of the first resin layer 32 may be formed in a range of 3 mm or more, for example, 3 to 5 mm. The first resin layer 32 is provided in the range of thickness, so that light may be diffused and wavelength-converted. Such a lighting module may be provided as a surface light source. The thickness of the first resin layer 32 may be equal to or less than the interval between the light emitting devices 21. Alternatively, the interval between the plurality of light emitting devices 21 may be equal to or greater than the thickness of the first resin layer 32.

The lighting module of FIG. 3 has a structure in which the first and second diffusion layers are removed in FIG. 1, and may provide a wavelength-converted surface light source by using the thickness of the first resin layer 32. The first resin layer 32 may include the function of the first and second diffusion layers disclosed in FIG. 1. The first resin layer 32 may be molded on the light emitting device 21 and cured. The lighting module according to an embodiment may have a thickness of 5.5 mm or less, may emit a surface light source via an upper surface and may have ductility characteristics. The lighting module may emit light via a side surface.

Figure 4:
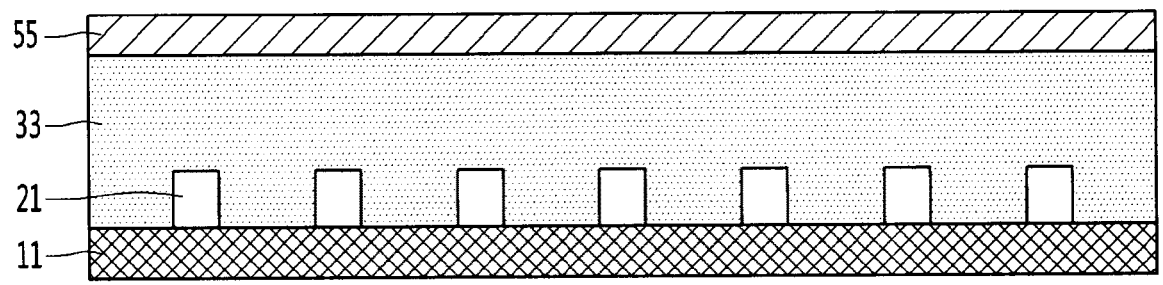
FIG. 4 is a view illustrating a second modified example of the lighting module of FIG. 1.

FIG. 4 is a second modified example of the lighting module of FIG. 1.

Referring to FIG. 4, a plurality of light emitting devices 21 are arranged on a substrate 11, the plurality of light emitting devices 21 are molded with a first resin layer 33, a first diffusion layer 55 may be disposed on the first resin layer 33. The lighting module is a configuration in which one layer is removed from the lighting module described in FIG. 1.

The first resin layer 33 may mold the light emitting device 21. The first resin layer 33 may be formed of a resin material having a diffusing agent, and then cured. Here, a content of the diffusing agent may be added in a range of 1.5 to 2.5 wt % based on the amount of the first resin layer 33 in the process. The first resin layer 33 may be formed of a transparent resin material, for example, an ultraviolet (UV) resin, epoxy or silicone. The first diffusion layer 55 and the first resin layer 33 may be the same resin material. The lighting module may provide a thin module thickness by removing a part of the layers of FIG. 1, and may diffuse light via the first resin layer 33 to reduce hot spots. The first resin layer 33 may include the function of a layer having a diffusing agent in FIG. 1.

A thickness of the first resin layer 33 may be formed in a range of 3 mm or more, for example, 3 to 4 mm, so that the deterioration in light diffusion may be prevented. The first resin layer 33 may include a diffusing agent (beads or a dispersing agent). The first resin layer 33 may be disposed between the substrate 11 and the first diffusion layer 55. The first resin layer 33 may diffuse the light emitted via the light emitting device 21. Therefore, generation of hot spots due to light emitted via the first resin layer 33 may be reduced. The diffusing agent may have a size larger than the wavelength of the light emitted from the light emitting device 21. Since such a diffusing agent is disposed with a size larger than the wavelength, the light diffusion effect may be improved.

A content of the diffusing agent may be in a range of 5 wt % or less, for example, 2 to 5 wt % in the first resin layer 33. When the content of the diffusing agent is smaller than the range, there is a limit to lowering hot spots. When the content is larger than the range, the light transmittance may be deteriorated. Therefore, the diffusing agent is disposed in the first resin layer 33 in the above-described content, and thus light may be diffused to reduce hot spots without deteriorating the light transmittance.

The first diffusion layer 55 may include a phosphor, and the phosphor may include, for example, at least one of a red phosphor, an amber phosphor, a yellow phosphor, a green phosphor, and a white phosphor. The phosphor added in the first diffusion layer 55 may have a difference in content with the resin material of the first diffusion layer 55 by 20% or less or 10% or less. A content of the phosphor may be added to the first diffusion layer 55 in a range of 40 wt % or more or 40 to 60 wt %. Accordingly, the color at a surface of the first diffusion layer 55 may be provided in the color tone of the phosphor, and the diffusion and wavelength-conversion efficiency of light may be improved. In addition, it is possible to reduce the transmission of the wavelength, for example, the blue light, of light emitted from the light emitting device 21 via the first diffusion layer 55. Further, the light extracted via the first diffusion layer 55 may be provided as a surface light source by the wavelength of the phosphor. A thickness of the first diffusion layer 55 may be formed in a range of 0.3 mm or more, for example, 0.3 to 0.7 mm. The light may be diffused and wavelength-converted by providing the first diffusion layer 55 with the thickness in the range. Such a lighting module may be provided as a surface light source. The lighting module according to an embodiment may have a thickness of 5.5 mm or less, may emit a surface light source via an upper surface and may have ductility characteristics. The lighting module may emit light via a side surface.

Figure 5:
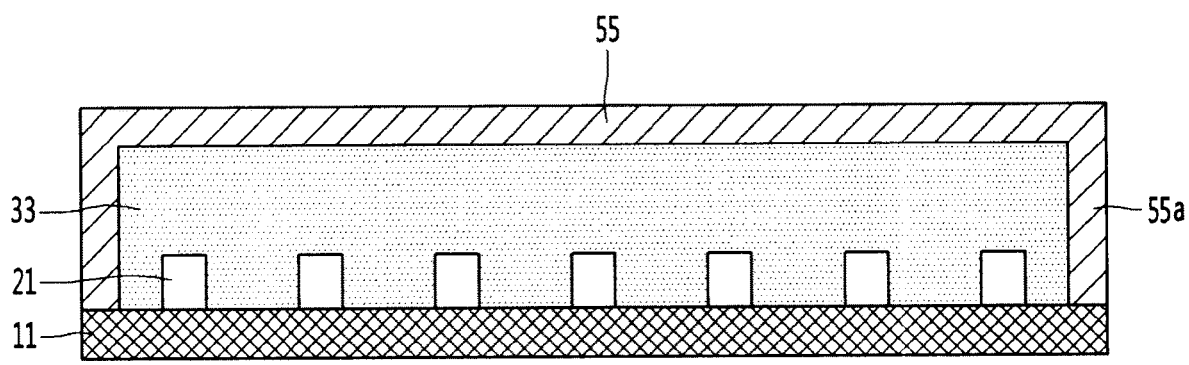
FIG. 5 is another example of the lighting module of FIG. 4.

FIG. 5 is another example of the lighting module of FIG. 4. Referring to FIG. 5, in the lighting module, a first diffusion layer 55 may be disposed on a first resin layer 33 covering the light emitting device 21 disclosed in an embodiment, and the first diffusion layer 55 may include a side portion 55a covering a side surface of the first resin layer 33. The side portion 55a of the first diffusion layer 55 is disposed along the side surface of the first resin layer 33 and covers the side surface of the first resin layer 33. The side portion 55a may be extended from an edge of an upper surface of the first resin layer 33 in the direction of the upper surface of the substrate 11. The side portion 55a of the first diffusion layer 55 may be in contact with the upper surface of the substrate 11. The side portion 55a of the first diffusion layer 55 is contacted along the outer circumference of the substrate 11, so that moisture penetration may be prevented and the side surface of the lighting module may be protected. The above-described phosphors may be added to the side portion 55a of the first diffusion layer 55, but the invention is not limited thereto. The side portion 55a of the first diffusion layer 55 may be formed at one side surface, at least two side surfaces or all side surfaces of the first resin layer 33 or may open at least one side surface. Some light may be extracted via the opened region.

Figure 6:
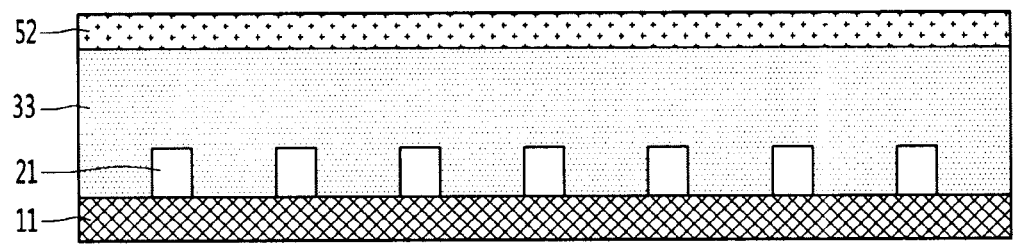
FIG. 6 is a view illustrating a third modified example of the lighting module of FIG. 1.

FIG. 6 is a third modified example of the lighting module of FIG. 1.

Referring to FIG. 6, a plurality of light emitting devices 21 may be disposed on a substrate 11, the plurality of light emitting devices 21 may be molded with a first resin layer 33, and a first diffusion layer 52 may be disposed on the first resin layer 33. The lighting module is a configuration in which one layer is removed from the lighting module described in FIG. 1.

The first resin layer 33 may mold the light emitting device 21. The first resin layer 33 may be formed of a resin material having a diffusing agent, and then cured. Here, a content of the diffusing agent may be added in a range of 1.5 to 2.5 wt % based on the amount of the first resin layer 33 in the process. The first resin layer 33 may be a transparent resin material, for example, an ultraviolet (UV) resin, epoxy or silicone. The lighting module may provide a thin module thickness by removing one layer from the module of FIG. 1 and diffuse light via the first resin layer 33 to reduce hot spots.

A thickness of the first resin layer 33 is formed in a range of 3 mm or more, for example, 3 to 4 mm, so that a deterioration in light diffusion may be prevented. The first resin layer 33 may include a diffusing agent (beads or a dispersing agent). The first resin layer 33 may be disposed between the substrate 11 and the first diffusion layer 52. The first resin layer 33 may diffuse the light emitted via the light emitting device 21. Therefore, generation of hot spots due to light emitted via the first resin layer 33 may be reduced. The diffusing agent may have a size larger than the wavelength of the light emitted from the light emitting device 21. Since such a diffusing agent is disposed with a size larger than the wavelength, the light diffusion effect may be improved.

A content of the diffusing agent may be in a range of 5 wt % or less, for example, 2 to 5 wt % in the first resin layer 33. When the content of the diffusing agent is smaller than the range, there is a limit to lowering hot spots. When the content is larger than the range, the light transmittance may be deteriorated. Therefore, the diffusing agent is disposed in the first resin layer 33 in the above-described content, and thus light may be diffused to reduce hot spots without deteriorating the light transmittance.

The first diffusion layer 52 may include a phosphor and a diffusing agent, and the phosphor may include at least one of a red phosphor, an amber phosphor, a yellow phosphor, a green phosphor, and a white phosphor. The diffusing agent may include at least one of polymethyl methacrylate (PMMA) series, $TiO_2$, $SiO_2$, $Al_2O_3$, and silicon series. The diffusing agent may include a metal oxide. The diffusing agent has a refractive index in a range of 1.4 to 2 at the light emission wavelength, and a size thereof may be in a range of 4 to 6 μm. The diffusing agent may be spherical, but is not limited thereto. As shown in FIG. 29, when the refractive index of the diffusing agent is 1.4 or more, for example, 1.4 to 2, the uniformity of light may be 90% or more. As shown in FIG. 30, when the size of the diffusing agent is in the range of 4 to 6 μm, the uniformity of light may be 90% or more. The diffusing agent may be spherical, but is not limited thereto. A content of the diffusing agent may be in a range of 5 wt % or less, for example, 2 to 5 wt % in the first resin layer 33. When the content of the diffusing agent is smaller than the range, there is a limit to lowering hot spots. When the content is larger than the range, the light transmittance may be deteriorated. Therefore, the diffusing agent is disposed in the first resin layer 33 in the above-described content, and thus light may be diffused to reduce hot spots without deteriorating the light transmittance.

The phosphor added in the first diffusion layer 52 may have a difference in content with the resin material of the first diffusion layer 52 by 35% or less or 25% or less. The content of the phosphor may be added to the first diffusion layer 52 in a range of 35 wt % or more or 35 to 45 wt %. The content of the phosphor in the first diffusion layer 52 may be 5 times or more than a content of the diffusing agent. Accordingly, the color at a surface of the first diffusion layer 52 may be provided in the color tone of the phosphor, and the diffusion and wavelength-conversion efficiency of light may be improved. In addition, it is possible to reduce the transmission of the wavelength, for example, the blue light, of the light emitted from the light emitting device 21 via the first diffusion layer 52. Further, the light extracted via the first diffusion layer 52 may be provided as a surface light source by the wavelength of the phosphor. A thickness of the first diffusion layer 52 may be formed in a range of 0.3 mm or more, for example, 0.3 to 0.7 mm. The light may be diffused and wavelength-converted by providing the first diffusion layer 52 with the thickness in the range. Such a lighting module may be provided as a surface light source. The lighting module may be provided as a flexible surface light source module having a thin thickness.

Figure 7:
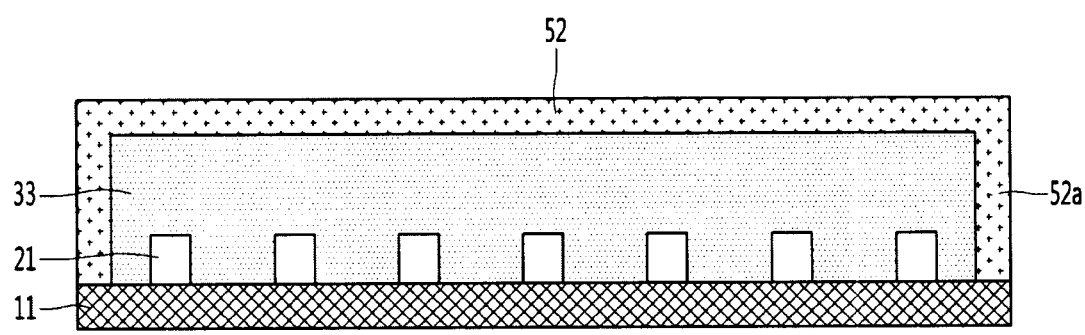
FIG. 7 is another example of the lighting module of FIG. 6.

FIG. 7 is another example of the lighting module of FIG. 6.

Referring to FIG. 7, in the lighting module, a first diffusion layer 52 may be disposed on a first resin layer 33 covering the light emitting device 21 disclosed in an embodiment, and the first diffusion layer 52 may include a side portion 52a covering a side surface of the first resin layer 33. The side portion 52a of the first diffusion layer 52 may cover along the side surface of the first resin layer 33 and may be extended in the direction of the upper surface of the substrate 11. The side portion 52a of the first diffusion layer 52 may be in contact with the upper surface of the substrate 11. The side portion 52a of the first diffusion layer 52 is contacted along the outer circumference of the substrate 11, so that moisture penetration may be prevented and the side surface of the lighting module may be protected. The above-described phosphor and diffusing agent may be added to the side portion of the first diffusion layer 52, but is not limited thereto. The side portion 52a of the first diffusion layer 52 may be formed at one side surface, at least two side surfaces or all side surfaces of the first resin layer 33 or may open at least one side surface. Some light may be extracted via the opened region.

Figure 8:
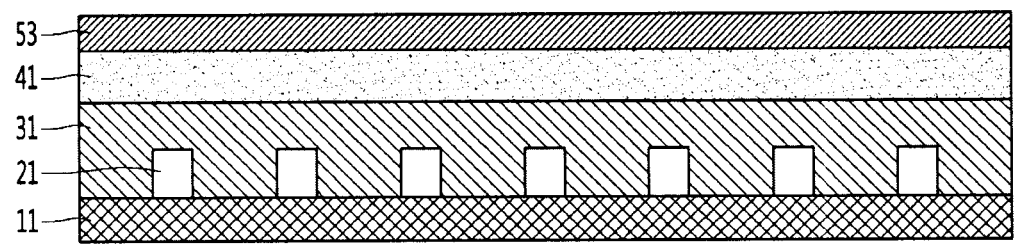
FIG. 8 is a view illustrating a fourth modified example of the lighting module of FIG. 1.

FIG. 8 is a fourth modified example of the lighting module of FIG. 1. The fourth modified example is an example modified from the structure of FIG. 1, and the following description will focus on an example different from the description of FIG. 1.

Referring to FIG. 8, the lighting module may include a substrate 11, a plurality of light emitting devices 21 on the substrate 11, a first resin layer 31 covering the light emitting devices 21, a first diffusion layer 41 on the first resin layer 31 and a second diffusion layer 53 on the first diffusion layer 41. The configuration of the first and second diffusion layers will be described with reference to the description of FIG. 1. The second diffusion layer 53 may be defined as a second resin layer, a diffusion layer, or a phosphor layer.

The second diffusion layer 53 may include a phosphor and a diffusing agent, and the phosphor may include at least one of a red phosphor, an amber phosphor, a yellow phosphor, a green phosphor, and a white phosphor. The diffusing agent may include at least one of polymethyl methacrylate (PMMA) series, $TiO_2$, $SiO_2$, $Al_2O_3$, and silicon series. The diffusing agent has a refractive index in a range of 1.4 to 2 at the light emission wavelength, and a size thereof may be in a range of 4 to 6 µm. The diffusing agent may be spherical, but is not limited thereto. As shown in FIG. 29, when the refractive index of the diffusing agent is 1.4 or more, for example, 1.4 to 2, the uniformity of light may be 90% or more, and as shown in FIG. 30, when the size of the diffusing agent is in the range of 4 to 6 µm, the uniformity of light may be 90% or more.

The diffusing agent may be spherical, but is not limited thereto. A content of the diffusing agent may be in a range of 5 wt % or less, for example, 2 to 5 wt % in the first diffusion layer 41. When the content of the diffusing agent is smaller than the range, there is a limit to lowering hot spots. When the content is larger than the range, the light transmittance may be deteriorated. Therefore, the diffusing agent is disposed in the first diffusion layer 41 in the above-described content, and thus light may be diffused to reduce hot spots without deteriorating the light transmittance.

The phosphor added in the second diffusion layer 53 may have a difference in content with the resin material of the second diffusion layer 53 by 35% or less or 25% or less. A content of the phosphor may be added to the second diffusion layer 53 in a range of 35 wt % or more, or 35 to 45 wt %. Accordingly, the color at a surface of the second diffusion layer 53 may be provided with a color tone of the phosphor, and the diffusion and wavelength-conversion efficiency of light may be improved. In addition, it is possible to reduce the transmission of the wavelength, for example, the blue light, of light emitted from the light emitting device 21 via the second diffusion layer 53. Further, the light extracted via the second diffusion layer 53 may be provided as a surface light source by the wavelength of the phosphor. A thickness of the second diffusion layer 53 may be formed in a range of 0.3 mm or more, for example, 0.3 to 0.5 mm. The light may be diffused and wavelength-converted by providing the second diffusion layer 53 with the thickness in the range. Such a lighting module may be provided as a surface light source.

Figure 9:
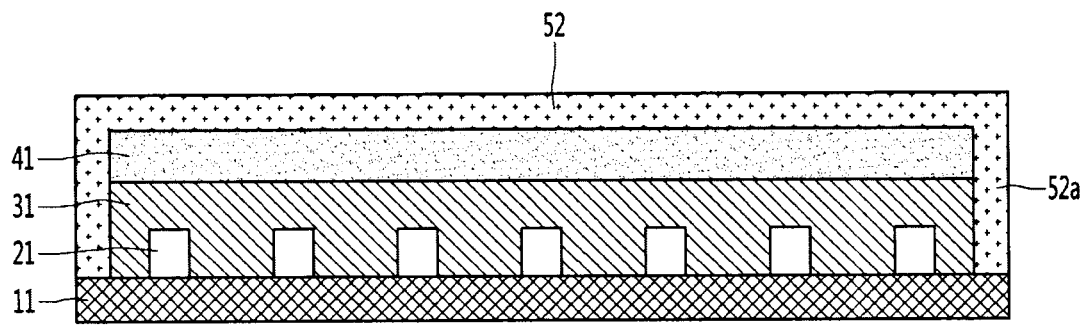
FIG. 9 is another example of the lighting module of FIG. 8.

FIG. 9 is another example of the lighting module of FIG. 8, in which the first and second diffusion layers in the lighting module of FIG. 8 are the same and further include a side portion 52a of the second diffusion layer 52. The second diffusion layer 52 may include a side portion 52a covering side surfaces of the first resin layer 31 and the first diffusion layer 41. The side portion 52a of the second diffusion layer 52 may cover along the side surfaces of the first resin layer 31 and the first diffusion layer 41 and may be extended in the direction of the upper surface of the substrate 11. The side portion 52a of the second diffusion layer 52 may be in contact with the upper surface of the substrate 11. The side portion 52a of the second diffusion layer 52 is contacted along the outer circumference of the substrate 11, so that moisture penetration may be prevented and the side surface of the lighting module may be protected. The above-described phosphor and the diffusing agent may be added to the side portion 52a of the second diffusion layer 52. The side portion 52a of the first diffusion layer 52 may be formed at one side surface, at least two side surfaces or all side surfaces of the first resin layer 31 and the first diffusion layer 41 or may open at least one side surface.

Figure 10:
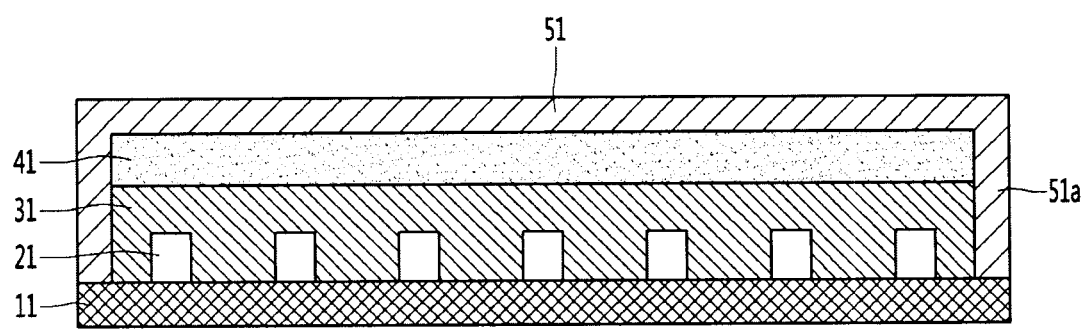
FIG. 10 is another example of the lighting module of FIG. 1.

FIG. 10 is another example of the lighting module of FIG. 1, in which the first and second diffusion layers in the lighting module of FIG. 1 are the same and further include a side portion 51a of the second diffusion layer 51. The second diffusion layer 51 may include a side portion 51a covering side surfaces of the first resin layer 31 and the first diffusion layer 41. The side portion of the second diffusion layer 51 may cover along the side surfaces of the first resin layer 31 and the first diffusion layer 41 and may be extended in the direction of the upper surface of the substrate 11. The side portion 51a of the second diffusion layer 51 may be in contact with the upper surface of the substrate 11. The side portion 51a of the second diffusion layer 51 is contacted along the outer circumference of the substrate 11, so that moisture penetration may be prevented and the side surface of the lighting module may be protected. The above-described phosphor may be added to the side portion 51a of the second diffusion layer 51, but is not limited thereto. The side portion 51a of the second diffusion layer 51 may be formed at one side surface, at least two side surfaces or all side surfaces of the first and second diffusion layers, or may open at least one side surface.

Figure 11:
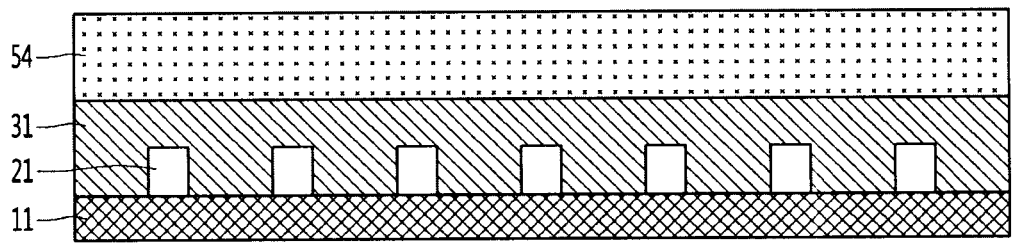
FIG. 11 is a fifth modified example of the lighting module of FIG. 1.

FIG. 11 is a fifth modified example of the lighting module of FIG. 1. The fifth modified example is an example modified from the structure of FIG. 1, and the following description will focus on an example different from the description of FIG. 1.

Referring to FIG. 11, the lighting module may include a substrate 11, a plurality of light emitting devices 21 on the substrate 11, a first resin layer 31 covering the light emitting devices 21, and a first diffusion layer 54 on the resin layer 31. The configuration of the first resin layer 31 will be described with reference to FIG. 1, and the configuration of the first resin layer 31 is a configuration in which one layer is removed from the lighting module of FIG. 1.

The first diffusion layer 54 may include a phosphor and a diffusing agent, and the phosphor may include, for example, at least one of a red phosphor, an amber phosphor or a yellow phosphor, a green phosphor, and a white phosphor. The diffusing agent may include at least one of polymethyl methacrylate (PMMA) series, $TiO_2$, $SiO_2$, $Al_2O_3$, and silicon series. The diffusing agent has a refractive index in a range of 1.4 to 2 at the light emission wavelength, and a size thereof may be in a range of 4 to 6 µm. The diffusing agent may be spherical, but is not limited thereto. As shown in FIG. 29, when the refractive index of the diffusing agent is 1.4 or more, for example, 1.4 to 2, the uniformity of light may be 90% or more. As shown in FIG. 30, when the size of the diffusing agent is in the range of 4 to 6 µm, the uniformity of light may be 90% or more. The diffusing agent may be spherical, but is not limited thereto. A content of the diffusing agent may be in a range of 5 wt % or less, for example, 2 to 5 wt % in the first diffusion layer 54. When the content of the diffusing agent is smaller than the range, there is a limit to lowering hot spots. When the content is larger than the range, the light transmittance may be deteriorated. Therefore, the diffusing agent is disposed in the first diffusion layer 54 in the above-described content, and thus light may be diffused to reduce hot spots without deteriorating the light transmittance.

The phosphor added in the first diffusion layer 54 may have a difference in content with the resin material of the first diffusion layer 54 by 35% or less or 25% or less. A content of the phosphor may be added to the first diffusion layer 54 in a range of 35 wt % or more or 35 to 45 wt %. The content of the phosphor in the first diffusion layer 54 may be 5 times or more higher than that of the diffusing agent. Accordingly, the color at a surface of the first diffusion layer 54 may be provided in the color tone of the phosphor, and the diffusion and wavelength-conversion efficiency of light may be improved. In addition, it is possible to reduce the transmission of the wavelength, for example, the blue light, of light emitted from the light emitting device 21 via the first diffusion layer 54. Further, the light extracted via the first diffusion layer 54 may be provided as a surface light source by the wavelength of the phosphor. A thickness of the first diffusion layer 54 may be in a range of 1.7 mm or more, for example, 1.7 to 2.2 mm. The light may be diffused and wavelength-converted by providing the first diffusion layer 54 with the thickness in the range. Such a lighting module may be provided as a surface light source. The lighting module may be provided as a flexible surface light source module having a thin thickness. The first diffusion layer 54 may be defined as a resin layer, a diffusion layer, or a phosphor layer.

Figure 12:
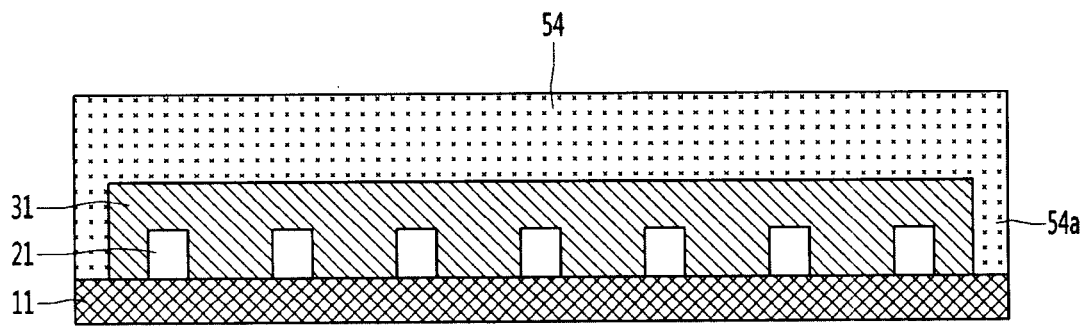
FIG. 12 is another example of the lighting module of FIG. 11.

FIG. 12 is another example of the lighting module of FIG. 11. The first resin layer 31 in the lighting module of FIG. 11 is the same, and a side portion 54a of a first diffusion layer 54 is further included. The first diffusion layer 54 may include a side portion 54a covering a side surface of the first resin layer 31. The side portion 54a of the first diffusion layer 54 may cover along the side surface of the first resin layer 31 and may be extended in the direction of the upper surface of the substrate 11. The side portion 54a of the first diffusion layer 54 may be in contact with the upper surface of the substrate 11. The side portion 54a of the first diffusion layer 54 is contacted along the outer circumference of the substrate 11, so that moisture penetration may be prevented and the side surface of the lighting module may be protected. The above-described phosphor may be added to the side portion 54a of the first diffusion layer 54, but the invention is not limited thereto. The side portion 54a of the first diffusion layer 54 may be formed at one side surface, at least two side surfaces or all side surfaces of the first resin layer 31 or may open at least one side surface.

Figure 13:
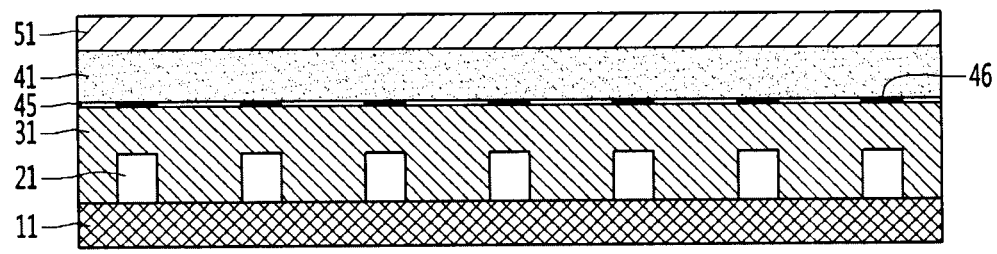
FIG. 13 is a sixth modified example of the lighting module of FIG. 1.

FIG. 13 is a sixth modified example of the lighting module of FIG. 1. FIG. 13 is a modified example between the first and second diffusion layers in the lighting module of FIG. 1.

Referring to FIG. 13, the lighting module may include a substrate 11, a light emitting device 21 disposed on the substrate 11, a first resin layer 31 on the substrate 11, an adhesive layer 45 and a light shielding portion 46 on the first resin layer 31, a first diffusion layer 41 on the adhesive layer 45 and the light shielding portion 46, and a second diffusion layer 51 on the first diffusion layer 41. In this lighting module, the first resin layer 31 and the first and second diffusion layers 41 and 51 are the same as the configuration in FIG. 1, and a duplicate description thereof will be omitted.

The adhesive layer 45 may be adhered between the first resin layer 31 and the first diffusion layer 41. The adhesive layer 45 may be the same material as that of the first resin layer 31 and the first diffusion layer 41 or may be formed of a different material. The adhesive layer 45 may be a resin material such as silicone or epoxy. The adhesive layer 45 may be disposed at a circumference of the light shielding portion 46 or may be extended to a lower surface of the light shielding portion 46. The light shielding portion 46 may be disposed at a lower surface of the first diffusion layer 41 at a region corresponding to the light emitting device 21. The light shielding portion 46 may be overlapped with the light emitting device 21 in a vertical direction. The light shielding portion 46 may be in a range of 50% or more, for example, 50% to 120% of the upper surface area of the light emitting device 21 on the light emitting device 21. The light shielding portion 46 may be formed through a region in which a white material is printed. The light shielding portion 46 may be printed by using, for example, a reflection ink including any one of $TiO_2$, $Al_2O_3$, $CaCO_3$, $BaSO_4$, and silicon. The light shielding portion 46 may reflect light emitted via the light exit surface of the light emitting device 21 to reduce the occurrence of hot spots due to the luminous intensity of light on the light emitting device 21. The light shielding portion 46 may print a light shielding pattern by using light shielding ink. The light shielding portion 46 may be formed to be printed at the lower surface of the first diffusion layer 41. The light shielding portion 46 may not shield 100% of incident light, but transmittance may be lower than reflectance, so that the light shielding portion 46 may perform a function of shielding and diffusing the light. The light shielding portion 46 may be formed as a single layer or multiple layers, and may have the same pattern shape or different pattern shapes.

The second diffusion layer 51 may include the above-described side portion to cover side surfaces of the first resin layer 31 and the first diffusion layer 41. As another example, the side portion may be formed by being extended by the first diffusion layer 41. As another example, although an example in which the side portion of the second diffusion layer 51 is in contact with the upper surface of the substrate 11 has been described, the side portion of the second diffusion layer 51 may be in contact with an upper surface of any one of the first resin layer 31 and the first diffusion layer 41. As another example, the side portion of the second diffusion layer 51 may be in contact with at least one of the upper surfaces of the first resin layer 31 and the first diffusion layer 41 and the upper surface of the substrate 11. In this case, the outer circumferences of the first resin layer 31 and the first diffusion layer 41 may be formed in a concave-convex pattern.

The lighting module according to an embodiment may have the best wavelength-conversion efficiency when a diffusion layer having a phosphor is disposed at the farthest position from the light emitting device. In such first to second diffusion layers, the order of the layers may be stacked as described above or may be stacked differently. For example, the first diffusion layer having the diffusing agent may be disposed adjacent to the light emitting device or further under the first resin layer. For example, the second diffusion layer having the phosphor may be disposed adjacent to the light emitting device or further under the first resin layer, but is not limited thereto. The lighting module may be provided as a flexible surface light source module having a thin thickness.

The upper surface area of the substrate 11 disclosed in the first embodiment may be equal to or greater than the lower surface area of the above-described first resin layer. The length of the substrate 11 in the first and second directions X and Y may be greater than that of the first resin layer in the first and second directions. The outer circumference of the substrate 11 may be extended outward beyond the side surface of the first resin layer. The outer circumference of the substrate 11 may be extended further outward beyond the side portions of the first and second diffusion layers. The length of the substrate 11 in the first and second directions may protrude in a range of 10% or less, or 1% to 10% from at least one of the side surface of the first resin layer and the side portions of the first and second diffusion layers.

Embodiments of the invention can solve the problem that the material of a diffusion plate such as a light guide plate is not flexible and thus is not suitable for a curved surface structure. In addition, the number of light emitting devices may be reduced for a surface light source.

An embodiment may provide a flexible lighting module having a plurality of resin layers, for example, a first resin layer 31, and diffusion layers 41 and 51, on a substrate 11.

A flexible lighting module having such a laminated structure may be provided. The lighting module of an embodiment allows light to be guided in a radial or straight direction in the first resin layer 31 to diffuse, to be diffused via the diffusing agent of the first diffusion layer 41, and to be wavelength-converted and diffused via the phosphor of the second diffusion layer 51.

Accordingly, the light to be finally emitted via the lighting module is emitted as the surface light source. In addition, the plurality of light emitting devices 21 in the lighting module 100 may emit light at five surfaces thereof on the flexible substrate in a flip manner, and the light emitted via the upper and side surfaces of the light emitting device 21 may be emitted in a direction of the first and second diffusion layers 41 and 51 and in a direction of a side of the first resin layer 31.

Second Embodiment

In describing the second embodiment, redundant description of the same configuration as that of the first embodiment will be omitted, and the same configuration as that of the first embodiment will refer to the first embodiment. The lighting module according to the second embodiment may include one or a plurality of resin layers on the light emitting device and the substrate. The resin layer may include, for example, one or more layers or two or more layers. The resin layer may optionally include at least two or three or more layers among an impurity-free layer, a layer to which a phosphor has been added, a layer having a diffusing agent, a layer to which ink particles have been added, a layer to which a phosphor and a diffusing agent have been added, and a layer to which a phosphor and ink particles have been added. The impurities may include a phosphor, a diffusing agent, or ink particles. At least one of the plurality of resin layers may optionally include at least one of a diffusing agent, a phosphor, and ink particles. That is, each of the phosphor, the diffusing agent and the ink particles may be added to a separate resin layer, or may be mixed with each other and disposed at one resin layer. At least one or two or more among the phosphor, the diffusing agent and the ink particles may be added to one resin layer. The layers in which the phosphor and the diffusing agent are respectively included may be disposed to be adjacent to each other or disposed to be spaced apart from each other. When the layers at which the phosphor and the diffusing agent are arranged are separated from each other, the layer at which the phosphor is disposed may be disposed above the layer at which the diffusing agent is disposed. The phosphor and the ink particles may be disposed at the same layer or at different layers from each other. The resin layer to which the ink particles are added may be disposed more above the resin layer to which the phosphor is added.

Figure 14:
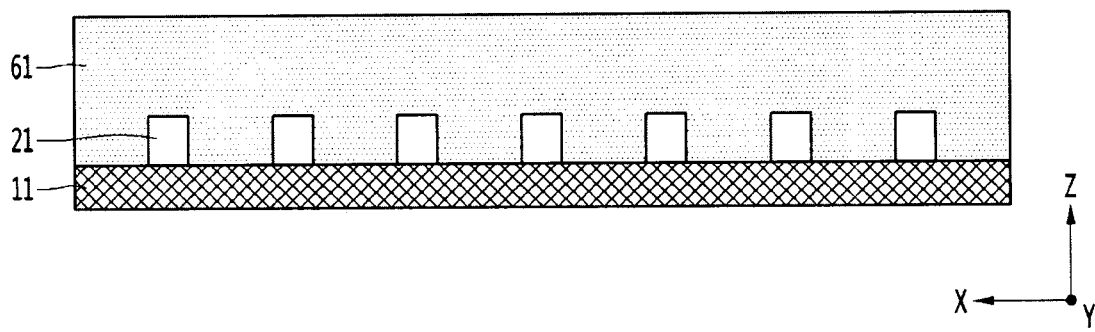
FIG. 14 is an example of a side sectional view of a lighting module according to a second embodiment of the invention.

FIG. 14 is a side cross-sectional view of a light emitting module according to a second embodiment.

Referring to FIG. 14, a lighting module 101 may include a substrate 11, a light emitting device 21 disposed on the substrate 11, and a first resin layer 61 covering the light emitting device 21 on the substrate 11. The substrate 11 and the light emitting device 21 will refer to the configuration disclosed in FIGS. 1 to 13.

The lighting module 101 may emit the light emitted from the light emitting device 21 as a surface light source. The lighting module 101 may include a reflection member disposed at an upper surface of the substrate 11. The reflection member may reflect light traveling to the upper surface of the substrate 11 to the first resin layer 61. The light emitting device 21 may be disposed on the substrate 11 in plural. The plurality of light emitting devices 21 disposed on the lighting module 101 may be arranged as shown in FIG. 2 or arranged in N columns and M rows (N and M are integers of 1 or more). A connector may be provided at a part of the upper surface or a lower surface of the substrate 11 to supply power to the light emitting devices 21.

The light emitting device 21 is an LED chip emitting at least five surfaces, and may be disposed on the substrate 11 in a flip chip type. As another example, the light emitting device 21 may be implemented as a horizontal chip or a vertical chip. The light emitting device 21 is a light emitting diode (LED) chip capable of emitting at least one of blue, red, green, ultraviolet (UV), and infrared rays. The light emitting device 21 may emit at least one of blue, red, and green. The light emitting device 21 may be sealed with a transparent insulating layer or resin at a surface thereof, but is not limited thereto. The light emitting device 21 may include a phosphor layer having a phosphor at the surface.

The light emitting device 21 is disposed on the substrate 11 and may be sealed by the first resin layer 61. The plurality of light emitting devices 21 may be in contact with the first resin layer 61. The first resin layer 61 may be disposed on a side surface and an upper surface of the light emitting device 21.

The first resin layer 61 may protect the light emitting devices 21 and may be in contact with the upper surface of the substrate 11. The light emitted from the light emitting device 21 may be emitted via the first resin layer 61. The light emitting device 21 may emit blue light in a range of 400 to 500 nm, for example, 420 to 470 nm.

The first resin layer 61 may be thicker than the light emitting device 21. The first resin layer 61 may be a resin material such as a transparent resin material, for example, an ultraviolet (UV) resin, silicone or epoxy.

The first resin layer 61 may include a phosphor. The first resin layer 61 may include a phosphor and ink particles. The first resin layer 61 may include a phosphor, ink particles, and a diffusing agent. The first resin layer 61 may include at least one or more of a phosphor, ink particles, and a diffusing agent. The phosphor may include at least one of a red phosphor, an amber phosphor, a yellow phosphor, a green phosphor, and a white phosphor. The diffusing agent may include at least one of polymethyl methacrylate (PMMA) series, $TiO_2$, $SiO_2$, $Al_2O_3$, and silicon series. The diffusing agent has a refractive index in a range of 1.4 to 2 at the light emission wavelength, and a size thereof may be in a range of 1 to 100 μm. The diffusing agent may be spherical, but is not limited thereto. As shown in FIG. 29, when the refractive index of the diffusing agent is 1.4 or more, the uniformity of light may be 90% or more. As shown in FIG. 30, when the size of the diffusing agent is in the range of 1 to 30 μm, the uniformity of light may be 90% or more. The light uniformity may be provided at 90% or more as the light uniformity on a region in which the light emitting devices 21 are connected to each other.

The ink particles may include at least one of metal ink, UV ink, and curing ink. A size of the ink particles may be smaller than that of the phosphor. A surface color of the ink particles may be one of green, red, yellow, and blue. A type of the ink may be selectively applied among polyvinyl chloride (PVC) ink, polycarbonate (PC) ink, acrylonitrile butadiene styrene (ABS) copolymer ink, UV resin ink, epoxy ink, silicone ink, polypropylene (PP) ink, polymethyl methacrylate (PMMA) ink, and polystyrene (PS) ink. Here, a width or diameter of the ink particles may be in a range of 5 µm or less, or 0.05 to 1 µm. At least one of the ink particles may be smaller than the wavelength of light.

The color of the ink particles may include at least one of red, green, yellow, and blue. For example, the phosphor emits a red wavelength, and the ink particles may include red. For example, the red color tone of the ink particles may be darker than the color tone of the wavelength of the phosphor or light. The ink particles may be a different color from the color of the light emitted from the light emitting device 21. The ink particles may give an effect of shielding or blocking incident light. The ink particles may include the same color series as the phosphor.

The lighting module 101 according to the second embodiment may include a phosphor and ink particles at the first resin layer 61. Since the light generated from the light emitting device 21 is shielded by the ink particles, hot spots may be reduced. A concentration of the phosphor may be remarkably reduced by the ink particles. For example, in the case of a lighting module without ink particles, a content of the phosphor may be increased to 35% or more, and in the case of the lighting module including the ink particles, the content of the phosphor may be reduced to 23% or less. The surface of the lighting module 101 or the surface of the first resin layer 61 may be provided similarly to the surface color by the first resin layer 61 having the ink particles when the light is emitted. That is, the chromaticity or color difference of the surface of the first resin layer 61 due to on/off of the light emitting device 21 may be reduced.

The first resin layer 61 may include a phosphor, a diffusing agent, and ink particles. In this case, a content of the diffusing agent may be in a range of 3 wt % or less, for example, 1 to 3 wt %. The content of the phosphor may be added in a range of 23 wt % or less or 10 to 23 wt %. A content of the ink particles may be added in a range of 12 wt % or less, for example, 4 to 12 wt %. In the first resin layer 61, the hot spots may be reduced by the content of the diffusing agent and a deterioration of light transmittance may be prevented. A decrease in wavelength-conversion efficiency may be prevented by the content of the phosphor. The difference of color tone of the surface color may be reduced by the content of the ink particles and the hot spots may be lowered.

When the first resin layer 61 includes a phosphor and ink particles, the diffusing agent may be 0 wt %. In such a structure, the content of the phosphor may be added in a range of 23 wt % or less or 10 to 23 wt %, and a content of the ink particles may be added in a range of 12 wt % or less, for example, 4 to 12 wt %. The content of the phosphor in the first resin layer 61 may be 3 wt % or more higher than that of the ink particles, or may be added much higher in the range of 3 to 13 wt %. The weight of the ink particles is smaller than that of the phosphor so that the ink particles may be distributed in a region closer to the surface of the first resin layer 61 than the phosphor. Accordingly, the color tone of the surface of the first resin layer 61 may be provided with the color tone of the ink particles. The transmission of light may be suppressed by such ink particles, and the hot spots may be lowered.

The color at the surface of the first resin layer 61 may be provided with the color tone of the ink particles and a difference in color tone of an appearance image due to on/off of the light emitting device 21 may be reduced, and deterioration of the wavelength-conversion efficiency may be prevented. In addition, it is possible to reduce the transmission of the wavelength or the blue light of the light emitted from the light emitting device 21 via the first resin layer 61. Further, the light emitted via the first resin layer 61 may be provided as a surface light source by the wavelength of the phosphor. A thickness of the first resin layer 61 may be formed in a range of 3 mm or more, for example, 3 to 5 mm. The thickness of the first resin layer 61 may be equal to or less than the interval between the light emitting devices 21.

The first resin layer 61 may be molded on the light emitting device 21 and cured. The lighting module 101 may have a thickness of 5.5 mm or less, may emit a surface light source via an upper surface and may have ductility characteristics. The lighting module 101 may emit light via the upper surface and the side surface.

Figure 15:
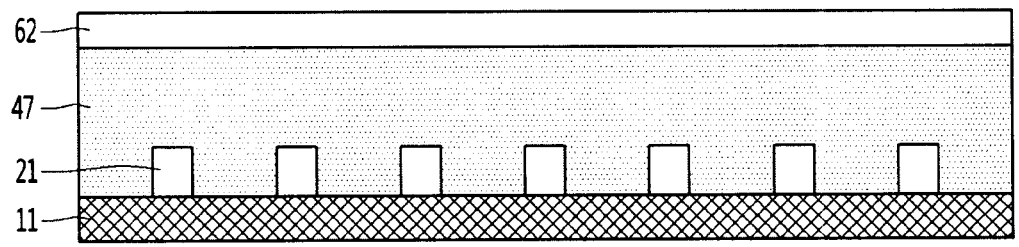
FIG. 15 is a first modified example of the lighting module according to the second embodiment.

FIG. 15 is a first modified example of the lighting module of FIG. 14.

Referring to FIG. 15, a lighting module 101A may include a substrate 11, a light emitting device 21, a first resin layer 47, and a first diffusion layer 62.

In the lighting module 101, a first structural example may include a diffusing agent and a phosphor at the first resin layer 47, and may include ink particles at the first diffusion layer 62. A second structural example may include a diffusing agent at the first resin layer 47 and may include a phosphor and ink particles at the first diffusion layer 62. A third structure example has an impurity-free layer at the first resin layer 47, and may include a phosphor, ink particles, and a diffusing agent at the first diffusion layer 62. A fourth structural example may add a phosphor to the first resin layer 47, and may include ink particles at the first diffusion layer 62. A fifth structural example has an impurity-free layer at the first resin layer 47 and may have a layer including a phosphor and ink particles at the first diffusion layer 62. The fourth structural example and the fifth structural example may not add a diffusing agent into the first resin layer 47 and the first diffusion layer 62.

A content of the diffusing agent may be in a range of 3 wt % or less, for example, 1 to 3 wt % in the first resin layer 47. When the content of the diffusing agent is smaller than the range, there is a limit to lowering hot spots. When the content is larger than the range, the light transmittance may be deteriorated. Therefore, the diffusing agent is disposed in the first resin layer 47 in the above-described content, and thus light may be diffused to reduce hot spots without deteriorating the light transmittance.

A content of the phosphor added to the first resin layer 47 or the first diffusion layer 62 may be added in a range of 23 wt % or less or 10 to 23 wt %. Accordingly, the diffusion and wavelength-conversion efficiency of light in the lighting module may be improved. In addition, it is possible to reduce the transmission of the wavelength, for example, the blue light, of light emitted from the light emitting device 21 via the first diffusion layer 62. Further, the light extracted via the first diffusion layer 62 may be provided as a surface light source by the wavelength of the phosphor. The phosphor may include at least one of a red phosphor, an amber phosphor, a yellow phosphor, a green phosphor, and a white phosphor.

A content of the ink particles added to the first diffusion layer 62 may be added in a range of 12 wt % or less or 4 to 12 wt %. Accordingly, the surface color at a surface of the first diffusion layer 62 may be improved and the diffusion of light and hot spots may be prevented. The color of the ink particles may be the same as the color of the wavelength-converted light by the phosphor. The color of the ink particles may be the same as the color of the phosphor.

The first resin layer 47 may mold the light emitting device 21 and may be in contact with an upper surface of the substrate 11. A thickness of the first resin layer 47 may be provided in a range of 3 mm or more, for example, 3 to 4 mm. Since the first resin layer 47 is provided in the thickness range, the spread of light may be improved. When at least one of the diffusing agent and the phosphor is disposed therein, the first resin layer 47 may improve light diffusibility.

The first diffusion layer 62 may be a resin material such as a transparent resin material, for example, an ultraviolet (UV) resin, epoxy or silicone. A refractive index of the first diffusion layer 62 may be 1.8 or less, for example, 1.1 to 1.8, or 1.4 to 1.6, and may be lower than a refractive index of the diffusing agent. A thickness of the first diffusion layer 62 may be smaller than that of the first resin layer 47. The thickness of the first diffusion layer 62 may be formed in a range of 0.3 mm or more, for example, 0.3 to 0.7 mm.

The phosphor added in the first diffusion layer 62 may have a difference in content with the resin material of the first diffusion layer 62 by 20% or less or 10% or less. The content of the phosphor may be added to the first diffusion layer 62 in a range of 10 wt % or more or 10 to 23 wt %. Accordingly, the color at a surface of the first diffusion layer 62 may be provided in the color tone of the phosphor, and the diffusion and wavelength-conversion efficiency of light may be improved. In addition, it is possible to reduce the transmission of the wavelength, for example, the blue light, of the light emitted from the light emitting device 21 via the first diffusion layer 62. Further, the light extracted via the first diffusion layer 62 may be provided as a surface light source by the wavelength of the phosphor. The light may be diffused and wavelength-converted by providing the first diffusion layer 62 with the thickness in the range. Such a lighting module may be provided as a surface light source. The red color tone of the first diffusion layer 62 in a state in which the light emitting device 21 is turned off may be darker or higher than that of the light emitted via the first diffusion layer 62 in a state in which the light emitting device 21 is turned on. That is, a surface chroma value of the light emitting device in the off state may be lower than that of the light emitting device in the on state. For example, in the off state of the light emitting device, a surface chroma value of the first diffusion layer 62 may be close to middle chroma, and when the light emitting device is in the on state, the surface chroma value of the first diffusion layer 62 or that of emitted light may be close to high chroma.

A thickness of the lighting module 101 may be in a range of 220% or less, for example, 180 to 220% of that of the first resin layer 47 or the thickness of the lighting module 101 may be a distance from a lower surface of the substrate 11 to an upper surface of the first diffusion layer 62. The first diffusion layer 62 may be formed to have a thickness smaller than that of the first resin layer 47. The thickness of the first diffusion layer 62 may be in a range of 80% or less, for example, 40 to 80% of that of the first resin layer 47. Since the first diffusion layer 62 is provided in a thin thickness, ductility characteristics of the lighting module may be secured. Since the lighting module 101 is provided with a thickness of 5.5 mm or less, the lighting module 101 may be provided as a flexible and slim surface light source module.

The lighting module according to an embodiment may have a thickness of 5.5 mm or less, may emit a surface light source via an upper surface and may have ductility characteristics. The lighting module may emit light via a side surface. The lighting module may include a flexible structure or a curved structure.

Figure 16:
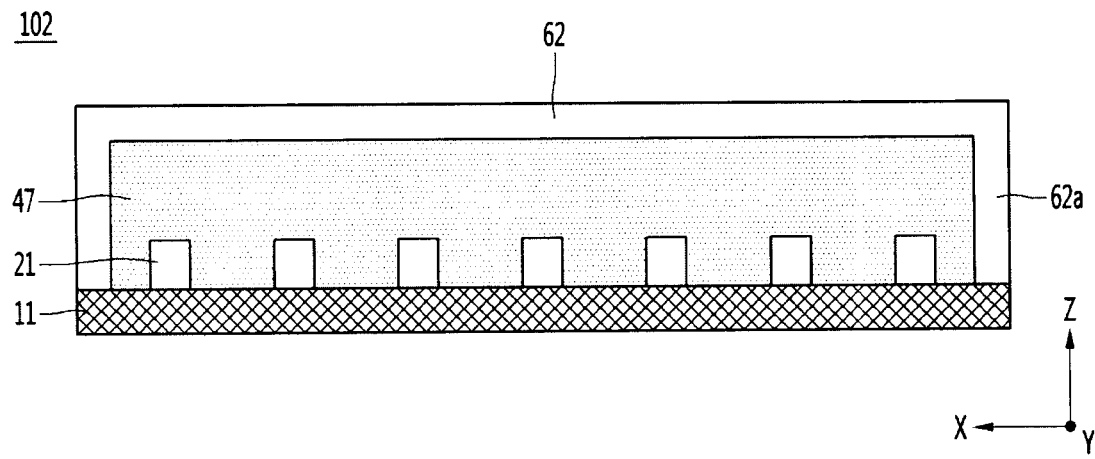
FIG. 16 is a second modified example of the lighting module of FIG. 15.

FIG. 16 is a modified example of the lighting module of FIG. 15, and the same part as configuration of FIG. 15 will be described with reference to the configuration and description of FIG. 15. Referring to FIG. 16, in a lighting module 102, a first diffusion layer 62 may be disposed on a first resin layer 47 covering the light emitting device 21 disclosed in an embodiment, and the first diffusion layer 62 may include a side portion 62a covering a side surface of the first resin layer 47. The first diffusion layer 62 may be defined as a second resin layer.

The side portion 62a of the first diffusion layer 62 is disposed along the side surface of the first resin layer 47 and covers the side surface of the first resin layer 47. The side portion 62a may be extended from an edge of an upper surface of the first resin layer 47 in a direction of an upper surface of the substrate 11. The side portion 62a of the first diffusion layer 62 may be in contact with the upper surface of the substrate 11. The side portion 62a of the first diffusion layer 62 is contacted along the outer circumference of the substrate 11, so that moisture penetration may be prevented and a side surface of the lighting module may be protected. The side portion 62a of the first diffusion layer 62 may include the above-described phosphor and ink particles. The side portion 62a of the first diffusion layer 62 may be formed at one side surface, at least two side surfaces or all side surfaces of the first resin layer 47 or may open at least one side surface. Some light may be extracted via the opened region.

Since ink particles are added to the first diffusion layer 62 and the side portion 62a, a difference between the color tone of the surface color of the first diffusion layer 62 when the light emitting device 21 is driven and the color tone of that when the light emitting device 21 is not driven may be reduced. That is, the color tone due to the ink particles may be seen in a clearer and deeper color even when the light emitting device 21 is turned off when viewed from a relatively far distance. Accordingly, even when the light emitting device 21 is in an on/off state, the difference in the color tone of the surface of the lighting module may be reduced. A content of the ink particles added to the side portion 62a of the first diffusion layer 62 may be equal to or higher than an upper surface portion of the first diffusion layer 62.

An adhesive may be disposed between the first resin layer 47 and the first diffusion layer 62. The adhesive may be, as a transparent material, an adhesive such as UV adhesive, silicone or epoxy. The first diffusion layer 62 may be adhered in a film form or may be injection-molded. When the first diffusion layer 62 is provided in the form of a film, the first diffusion layer 62 may be adhered with an adhesive, may provide a uniform light distribution, and may provide the color tone of a surface color at a predetermined level or more. The first diffusion layer 62 may be a second resin layer to be described later. As another example, without the adhesive, the first diffusion layer 62 may be attached with the surface adhesion of the first resin layer 47. The phosphor in the first diffusion layer 62 may be disposed on the upper surface of the first resin layer 47 or may be spaced apart from the light emitting device 21. The phosphor and ink particles in the first diffusion layer 62 may be disposed on the upper surface of the first resin layer 47. The phosphor and the ink particles may be disposed to be spaced from the light emitting device 21 or disposed on the upper surface of the first resin layer 47. As the phosphor moves away from the light emitting device 21, wavelength-conversion efficiency may be improved. As the ink particles move away from the light emitting device 21 or closer to the surface of the first diffusion layer 62, visibility of the surface color may be improved.

In the second embodiment of the invention, a comparison of luminous flux according to the content of phosphor and ink particles added to the first diffusion layer 62 without adding a diffusing agent to the first resin layer 47 is as follows. For experiment, as shown in Table 1, a red phosphor and red ink particles are added to the first diffusion layer in an example, and a reference example Ref is an example in which the content of the red phosphor without red ink particles is 50 wt % and the content of the diffusing agent is 10 wt %.

In Example 1, Example 2, and Example 3 in the first diffusion layer 62, the content of the phosphor is 10 wt % and the content of the red ink particles is 5 wt %, 7 wt %, and 10 wt %, respectively. In Examples 4, 5 and 6, the content of the phosphor is 15 wt % and the content of the red ink particles is 5 wt %, 7 wt %, and 10 wt %, respectively. In Examples 7, 8 and 9, the content of the phosphor is 20 wt % and the content of the red ink particles is 5 wt %, 7 wt %, and 10 wt %, respectively.

TABLE 1

|           | Phosphor [wt %] | Red Ink [wt %] |
|-----------|-----------------|----------------|
| Example 1 | 10              | 5              |
| Example 2 |                 | 7              |
| Example 3 |                 | 10             |
| Example 4 | 15              | 5              |
| Example 5 |                 | 7              |
| Example 6 |                 | 10             |
| Example 7 | 20              | 5              |
| Example 8 |                 | 7              |
| Example 9 |                 | 10             |

In the structure of FIGS. 15 and 16, Table 1 shows a configuration in which Examples 1 to 9 are tested such that the phosphor and the ink particles are added to the first diffusion layer in the above-described contents.

Figure 35:
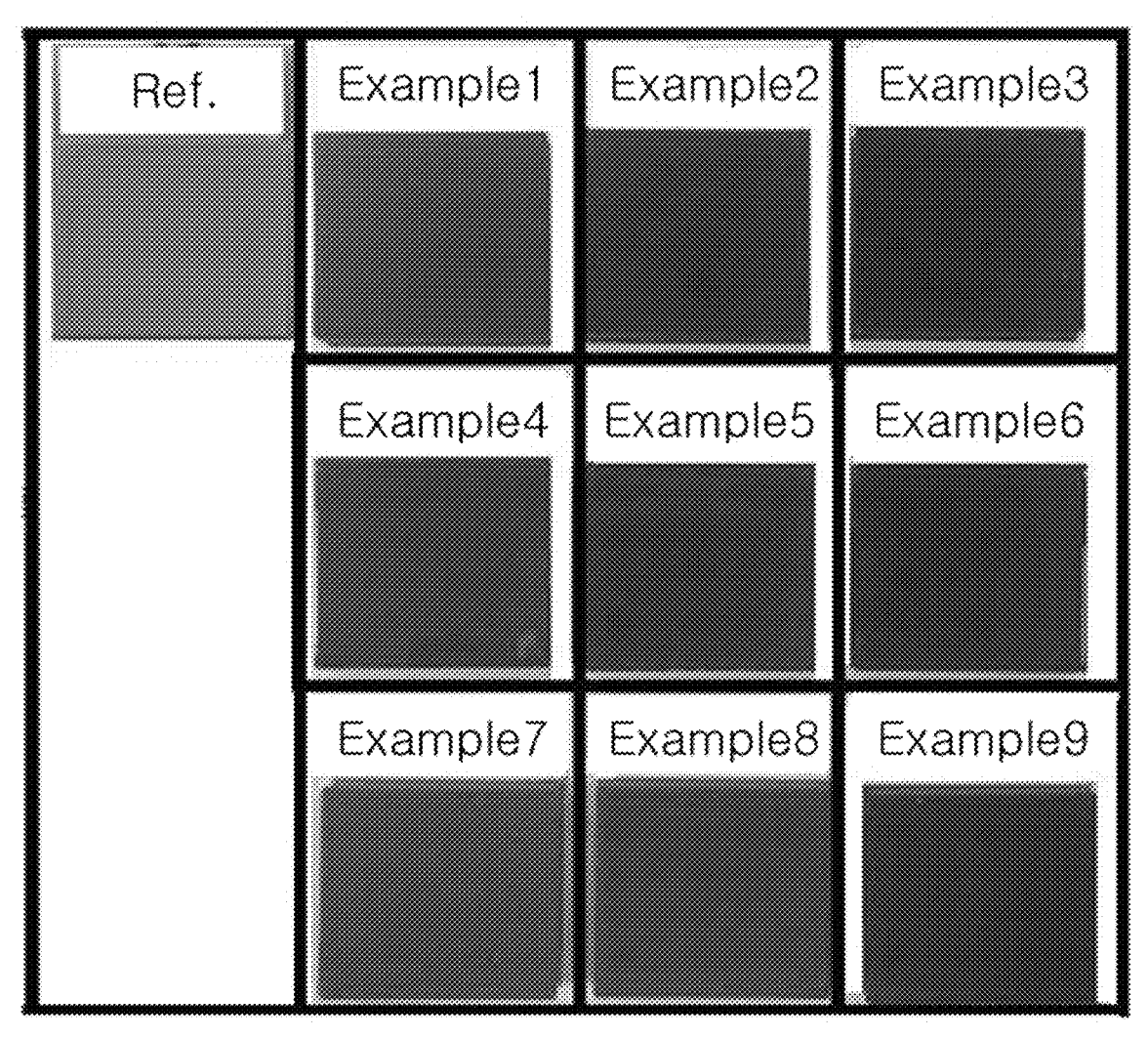
Figure 36:
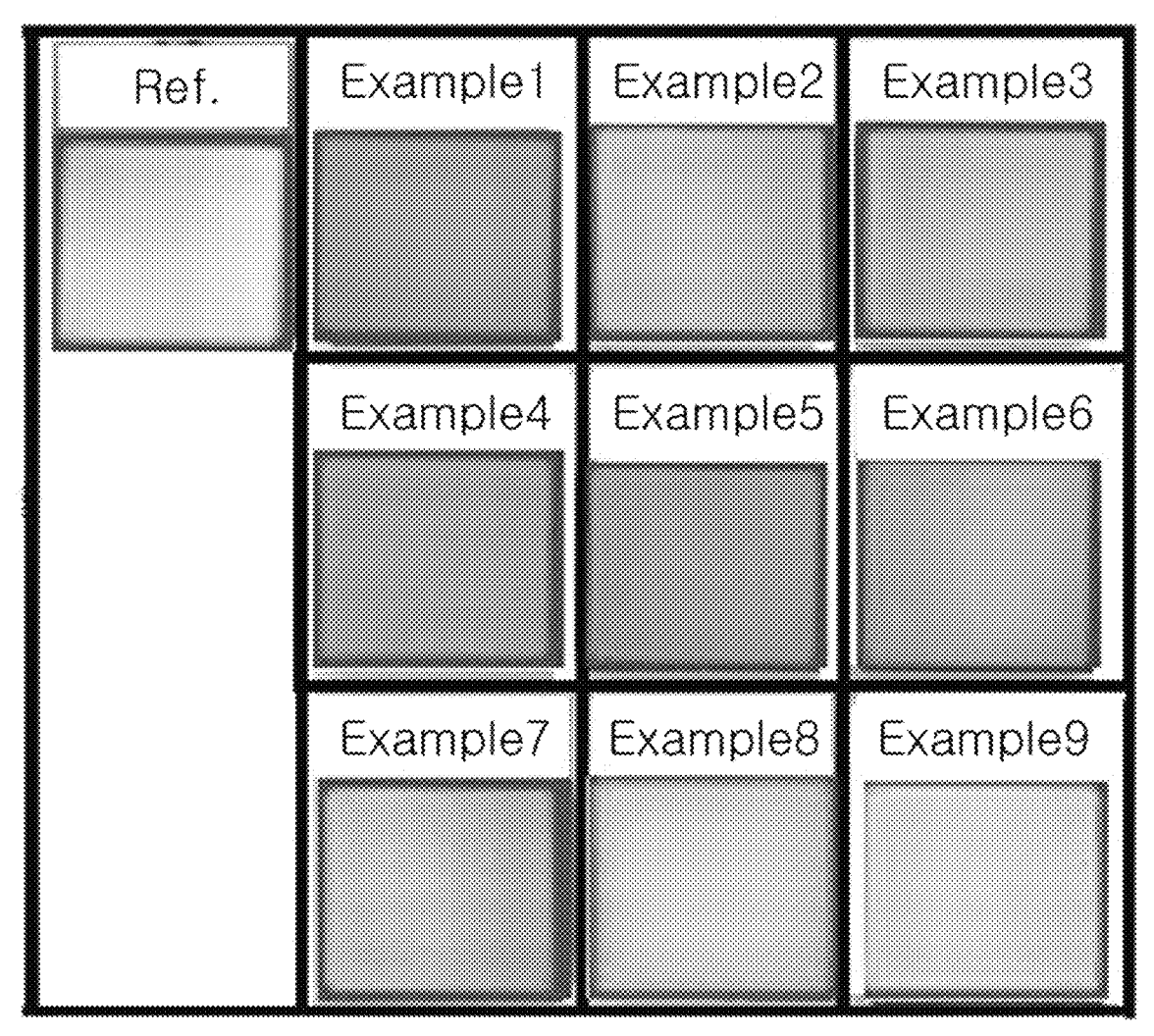

FIG. 35 is a view illustrating a comparison of a color tone of a reference example with a color tone of a surface color of Examples 1 to 9 in a state in which the light emitting device 21 is turned off in the lighting module of FIGS. 15 and 16. FIG. 36 is a view illustrating a comparison of a color tone of a reference example with a color tone of a surface color of Examples 1 to 9 in a state in which the light emitting device 21 is turned on in the lighting module of FIGS. 15 and 16. Here, the surface in the lighting module represents the surface of the first diffusion layer.

As shown in FIGS. 35 and 36, when the light emitting device 21 is in the off state, the surface color of the reference example Ref becomes amber, but in Examples 1 to 9, the surface color becomes red. When the light emitting device 21 is in the on state, it can be seen that the color tone of the surface color may be brighter as the content of the phosphor increases, and the luminous flux is deteriorated as the content of the ink particles increases.

Table 2 is a table illustrating a comparison of the color coordinates and the luminous fluxes of the reference example and Examples 1 to 9 of Table 1, respectively.

TABLE 2

| Experimental Example | CIE (Cx, Cy)           | Luminous flux (lm) |
|----------------------|------------------------|--------------------|
| Ref                  | Cx: 0.6903  Cy: 0.3011 | 74.88              |
| Example 1            | Cx: 0.6882  Cy: 0.3053 | 59.86              |
| Example 2            | Cx: 0.6912  Cy: 0.3006 | 43.60              |
| Example 3            | Cx: 0.6942  Cy: 0.2968 | 30.70              |
| Example 4            | Cx: 0.6902  Cy: 0.3031 | 63.75              |
| Example 5            | Cx: 0.6885  Cy: 0.3028 | 52.27              |
| Example 6            | Cx: 0.6938  Cy: 0.2971 | 34.08              |
| Example 7            | Cx: 0.6921  Cy: 0.3011 | 60.45              |
| Example 8            | Cx: 0.6872  Cy: 0.3037 | 53.63              |
| Example 9            | Cx: 0.6917  Cy: 0.2994 | 34.46              |

In Table 2, the luminous flux is the highest in the reference example. However, as shown in FIGS. 35 and 36, the difference in the color tone of the appearance image depending on the on/off state of the light emitting device in the lighting module is large. In this case, the visibility of the module may be deteriorated when the light emitting device is turned off. In addition, the case may also cause an increase in the content of the phosphor.

It can be seen that in Examples 1 to 9, the difference in color coordinates from the reference example is not large, and the color tone of the appearance image shows in red in the on/off state of the light emitting device. Example 1, Example 4 and Example 7 in which the difference in the luminous flux is 20% or less and the color tone of the surface is red, as compared with the reference example may be selected among Examples 1 to 9. Here, in Examples 1, 4 and 7, when the content of the red ink particles with respect to the first diffusion layer is in the range of 5 wt %, and the content of the phosphor is in the range of 10 wt % to 20 wt %, it can be seen that luminous flux is the highest.

Figure 37:
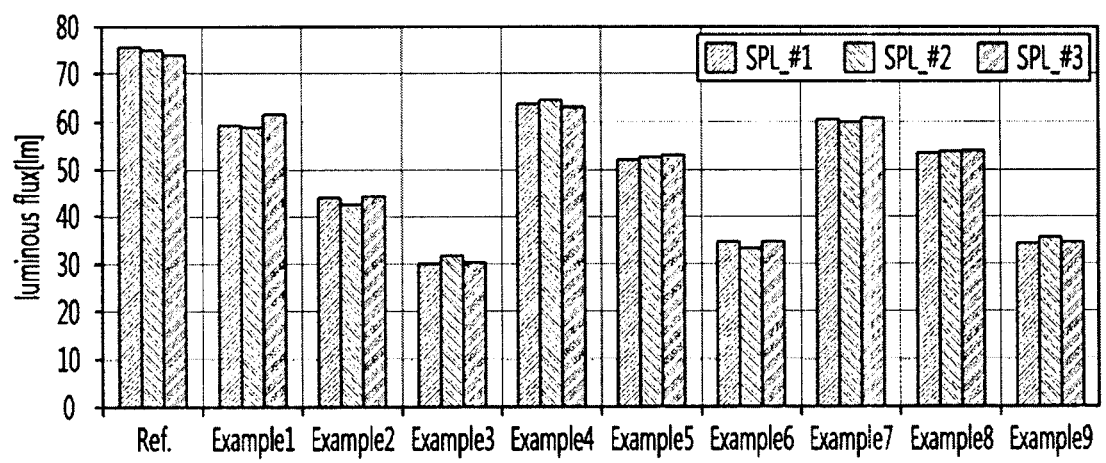
FIG. 37 is a view illustrating a comparison of light flux distributions according to a sample and a case of the lighting module according to the second embodiment.
Figure 38:
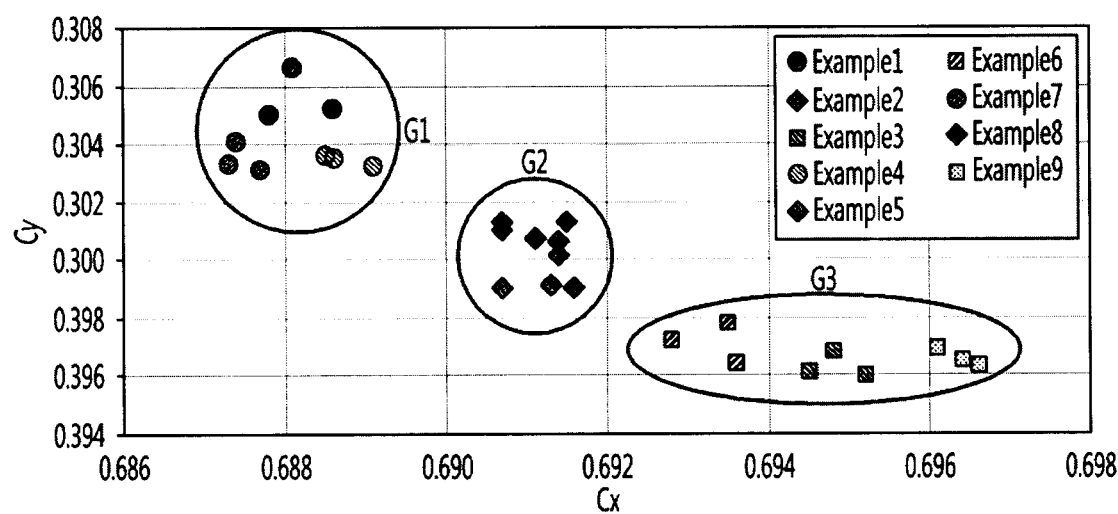
FIG. 38 is a view illustrating a comparison of a color coordinate distribution by case according to contents of a phosphor and ink particles in the lighting module according to the second embodiment.

As shown in FIG. 37, the Examples 1 to 9 show the comparison of luminous fluxes in the samples (spl #1, 2, 3) of the lighting module provided with the first diffusion layer by adding the above-described contents of the phosphor and the ink particles, and as shown in FIG. 38, Examples 1 to 9 of the samples may be distributed on the color coordinate regions G1, G2 and G3. That is, optimum Examples 1 to 9 may be selected and used based on the color coordinate regions of the samples 1, 2, and 3 of the lighting module. Therefore, the second embodiment of the invention may selectively add the content of the ink particles in the first diffusion layer in the range of 4 to 12 wt % and the content of the phosphor in the range of 10 wt % to 23 wt %, based on the above-described experimental examples.

Figure 17:
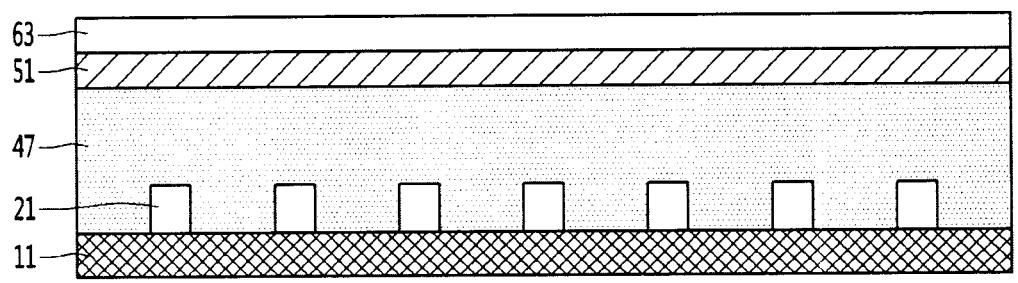
FIG. 17 is a third modified example of the lighting module according to the second embodiment.

FIG. 17 is a third modified example of the lighting module according to the second embodiment.

Referring to FIG. 17, the lighting module may include a substrate 11, a light emitting device 21, a first resin layer 47, a second diffusion layer 51, and a second resin layer 63. The first resin layer may include a diffusing agent or may be provided without a diffusing agent. The first resin layer may be function as a first diffusion layer. The second diffusion layer 51 may be a layer to which a phosphor is added. The second resin layer 63 may be a layer to which ink particles are added. As another example, the second diffusion layer may be a layer to which a phosphor and a diffusing agent are added. As another example, the second resin layer 63 may include a phosphor and ink particles. Here, a phosphor may be added to the second diffusion layer and the second resin layer 63, and the second diffusion layer 51 and the second resin layer 63 may include the same phosphor or different phosphors.

The second resin layer 63 may be disposed on the second diffusion layer 51. The second diffusion layer 51 may be disposed between the first resin layer and the second resin layer 63. A thickness of the second resin layer 63 may be smaller than that of the second diffusion layer 51. The thickness of the second diffusion layer 51 may be formed in a range of 0.3 mm or more, for example, 0.3 to 0.7 mm. The thickness of the second resin layer 63 may be formed in a range of 0.1 mm or more, for example, 0.1 to 0.5 mm.

At least one or both of the second diffusion layer and the second resin layer 63 may cover a side surface of the first resin layer.

The phosphor may include at least one of red, green, blue, amber, and yellow phosphors. The ink particles may have the same color as the color of the phosphor or the wavelength-converted color from the phosphor.

Figure 18:
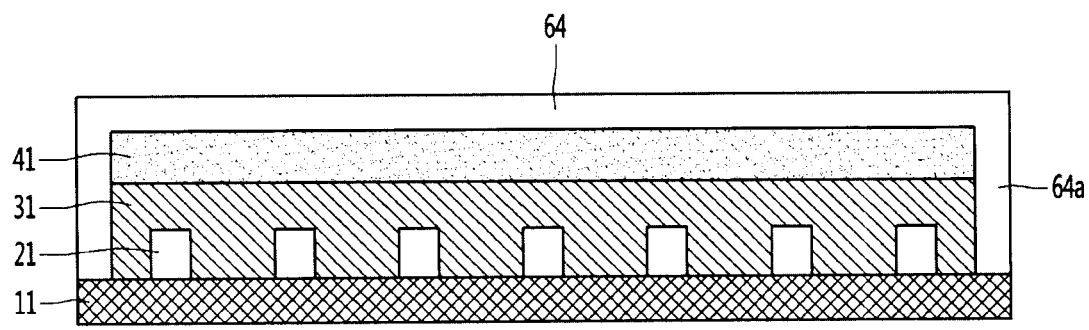
FIG. 18 is a fourth modified example of the lighting module according to the second embodiment.

FIG. 18 is a modified example of FIG. 17, and is a fourth modified example of the lighting module according to the second embodiment.

Referring to FIG. 18, the lighting module may include a substrate 11, a light emitting device 21, a first resin layer 31, a first diffusion layer 41, and a second resin layer 64. The second resin layer 64 may be disposed at a side surface of the first resin layer 31. A side portion 64a of the second resin layer 64 may be adhered to an upper surface of the substrate 11. The side portion 64a of the second resin layer 64 may be in contact with a side surface of the first diffusion layer 41 and the side surface of the first resin layer 31. Accordingly, the second resin layer 64 may improve the difference of color tone of the surface color in a side direction. A phosphor may be disposed at the first diffusion layer 41, or a phosphor and a diffusing agent may be added thereto. The second resin layer 64 may include a phosphor and ink particles.

Figure 19:
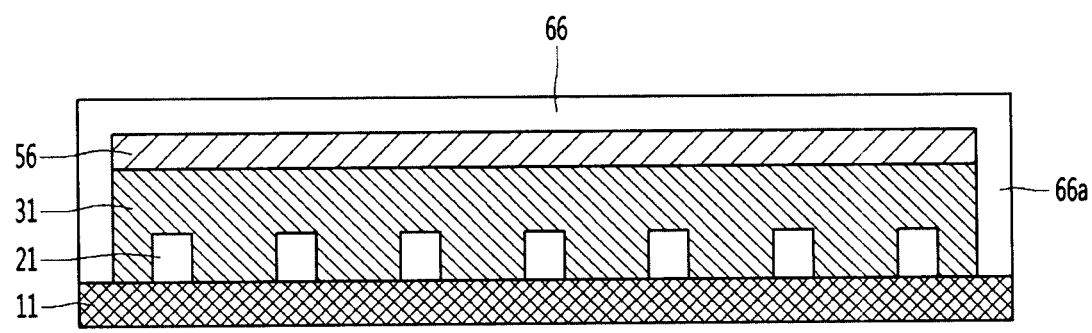
FIG. 19 is a fifth modified example of the lighting module according to the second embodiment.

FIG. 19 is a modified example of FIG. 17, and is a fifth modified example of the lighting module according to the second embodiment.

Referring to FIG. 19, the lighting module may include a substrate 11, a light emitting device 21, a first resin layer 31, a second diffusion layer 56, and a second resin layer 66. The second resin layer 66 may be disposed at a side surface of the first resin layer 31. The second resin layer 66 may be function as a first diffusion layer. A side portion 66a of the second resin layer 66 may be adhered to an upper surface of the substrate 11. The side portion 66a of the second resin layer 66 may be in contact with a side surface of the second diffusion layer 56 and the side surface of the first resin layer 31. A phosphor may be added to the second diffusion layer 56, or a phosphor and a diffusing agent may be added thereto. The second resin layer 66 may include ink particles without a phosphor. Accordingly, the second resin layer 66 may improve the difference of color tone of the surface color in a side direction.

Figure 20:
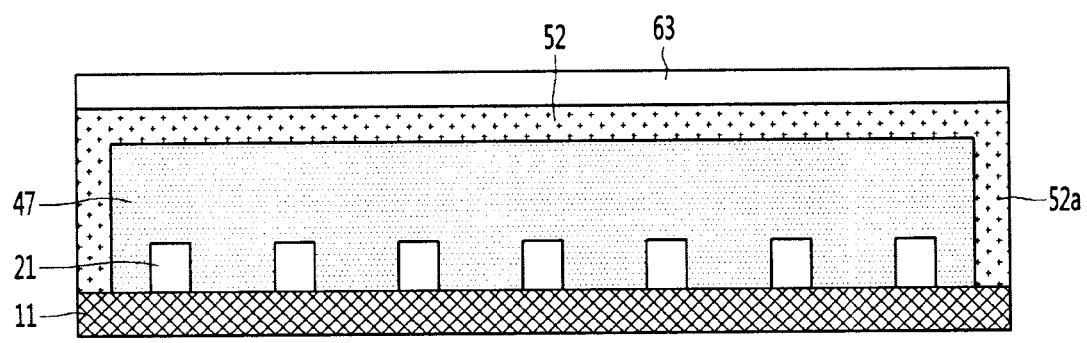
FIG. 20 is a sixth modified example of the lighting module according to the second embodiment.

FIG. 20 is a modified example of FIG. 17, and is a sixth modified example of the lighting module according to the second embodiment.

Referring to FIG. 20, the lighting module may include a substrate 11, a light emitting device 21, a first resin layer 47, a first diffusion layer 52, and a second resin layer 63. The first diffusion layer 52 may be disposed at a side surface of the first resin layer 47. A side portion 52a of the first diffusion layer 52 may be adhered to an upper surface of the substrate 11. The side portion 52a of the first diffusion layer 52 may be in contact with the side surface of the first resin layer 47. The first resin layer 47 may be provided with a transparent material with a diffusing agent added thereto or without a diffusing agent. A phosphor may be added to the first diffusion layer 52. The second resin layer 63 may include ink particles without a phosphor. The side portion 52a of the first diffusion layer 52 covers the side surface of the first resin layer 47. The side portion 52a of the first diffusion layer 52 may be exposed in a side direction of the lighting module. The surface color of the side portion 52a of the first diffusion layer 52 and the surface color of the second resin layer 63 may be different from each other. The surface color of the second resin layer 63 may have a darker color tone than that of the side portion 52a of the first diffusion layer 52.

Referring to FIGS. 17 and 20, the content of the ink particles added to the above-described resin layers 63, 64, and 66 may be added in the range of 12 wt % or less or 4 to 12 wt %. Accordingly, it is possible to improve the surface color at the surface of the resin layers 63, 64, and 66 and to prevent hot spots via light shielding. The color of the ink particles may be the same as the color of the wavelength-converted light by the phosphor. The color of the ink particles may be the same as the color of the phosphor.

The thickness of the diffusion layers 51, 41, and 52 may be formed in a range of 0.3 mm or more, for example, 0.3 to 0.7 mm. The content of the phosphor added to the diffusion layers 51, 41, and 52 may be added in a range of 10 wt % or more or 10 to 23 wt %.

FIGS. 21 to 24 are seventh to tenth modified examples of the second embodiment, and are a structure in which two or more layers are laminated on the first resin layer.

Figure 21:
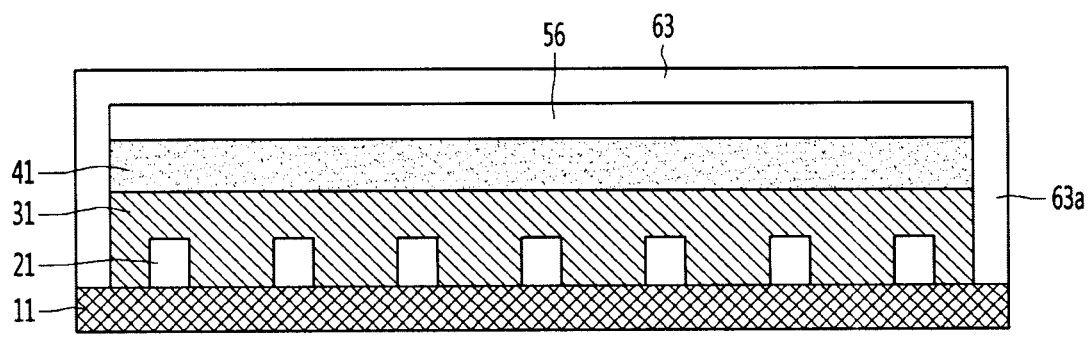
FIG. 21 is a seventh modified example of the lighting module according to the second embodiment.

Referring to FIG. 21, the lighting module may include a substrate 11, a light emitting device 21, a first resin layer 31, a first diffusion layer 41, a second diffusion layer 56, and a second resin layer 63. The configuration of the second resin layer 63 is the same as that of the above-described configuration, and the configuration of the first and second diffusion layers 41 and 56 will be described with reference to the description of the first embodiment.

For example, a diffusing agent may be added to the first diffusion layer 41, and a phosphor may be added to the second diffusion layer 56. The above-described ink particles may be added to the second resin layer 63. A side portion 63a of the second resin layer 63 covers side surfaces of the first and second diffusion layers 41 and 56 and a side surface of the first resin layer 31. The side portion 63a of the second resin layer 63 may be in contact with the side surfaces of the first and second diffusion layers 41 and 56 and the side surface of the first resin layer 31 and in contact with an upper surface of the substrate 11.

Figure 22:
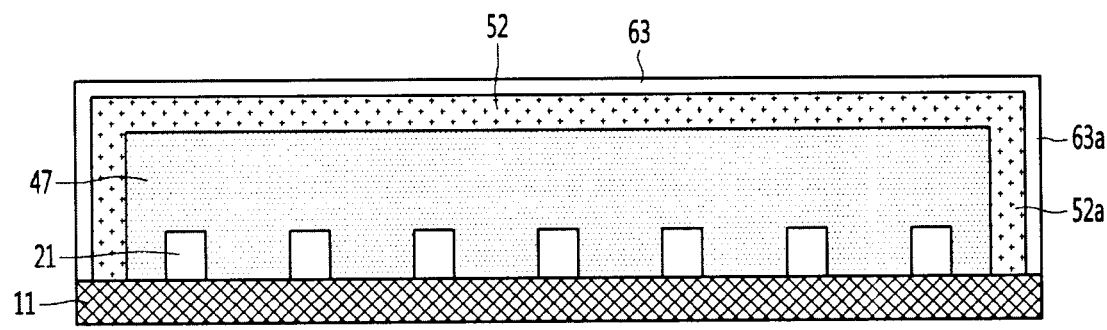
FIG. 22 is an eighth modified example of the lighting module according to the second embodiment.

Referring to FIG. 22, the lighting module may include a substrate 11, a light emitting device 21, a first resin layer 47, a first diffusion layer 52, and a second resin layer 63. The configuration of the second resin layer 63 is the same as the above-described configuration, and the configuration of the first diffusion layer 52 will be described with reference to the description of the first and second embodiments.

For example, a phosphor may be added to the first diffusion layer 52, or a phosphor and a diffusing agent may be added. When the first diffusion layer 52 has a diffusing agent, a phosphor and ink particles may be added to the second resin layer 63. When a phosphor is added to the first diffusion layer 52, the second resin layer 63 may include ink particles without a phosphor.

A side portion 52a of the first diffusion layer 52 may be disposed on a side surface of the second resin layer 63. A side portion 63a of the second resin layer 63 may be disposed at an outside of the side portion 52a of the first diffusion layer 52. The side portion 63a of the second resin layer 63 may be disposed between the side portion 52a of the first diffusion layer 52 and a side surface of the first resin layer 47. The side portion 52a of the first diffusion layer 52 and the side portion 63a of the second resin layer 63 may be in contact with an upper surface of the substrate 11.

Figure 23:
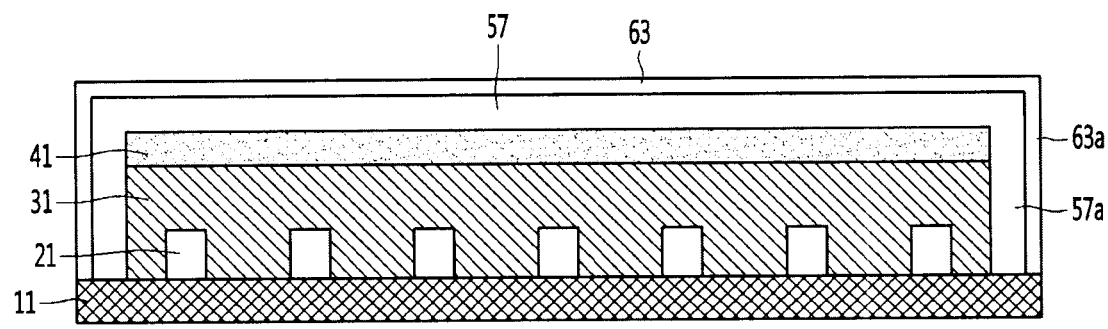
FIG. 23 is a ninth modified example of the lighting module according to the second embodiment.

Referring to FIG. 23, the lighting module may include a substrate 11, a light emitting device 21, a first resin layer 31, a first diffusion layer 41, a second diffusion layer 57, and a second resin layer 63. The configuration of the second resin layer 63 is the same as that of the above-described configuration, and the configuration of the first and second diffusion layers 41 and 57 will be described with reference to the description of the first embodiment.

For example, a diffusing agent may be added to the first diffusion layer 41, and a phosphor may be added to the second diffusion layer 57. The above-described ink particles may be added to the second resin layer 63.

A side portion 57a of the second diffusion layer 57 may be disposed on a side surface of the first resin layer 47. A side portion 63a of the second resin layer 63 may be disposed at an outside of the side portion 57a of the second diffusion layer 57. The side portion 63a of the second resin layer 63 may be disposed between the side portion 57a of the second diffusion layer 57 and a side surface of the first resin layer 31. The side portion 57a of the second diffusion layer 57 and the side portion 63a of the second resin layer 63 may be in contact with an upper surface of the substrate 11.

Figure 24:
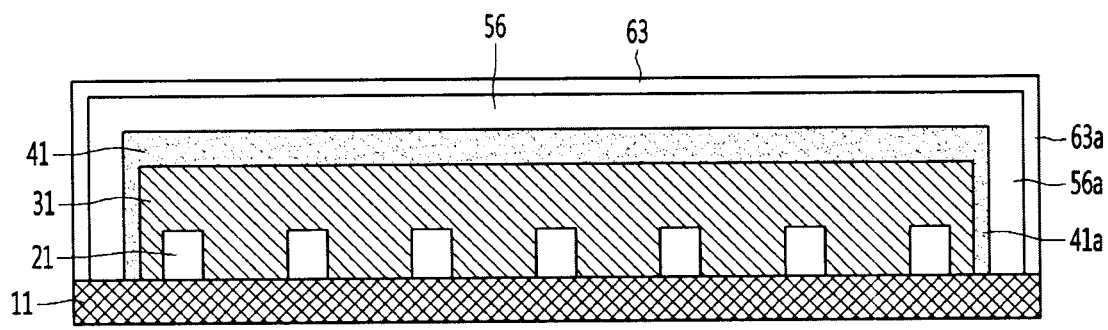
FIG. 24 is a tenth modified example of the lighting module according to the second embodiment.

Referring to FIG. 24, the lighting module may include a substrate 11, a light emitting device 21, a first resin layer 31, a first diffusion layer 41, a second diffusion layer 56, and a second resin layer 63. The configuration of the second resin layer 63 is the same as that of the above-described configuration, and the configuration of the first and second diffusion layers 41 and 56 will be described with reference to the description of the first embodiment.

For example, a diffusing agent may be added to the first diffusion layer 41, and a phosphor may be added to the second diffusion layer 56. The above-described ink particles may be added to the second resin layer 63.

A side portion 41a of the first diffusion layer 41 may be disposed on a side surface of the first resin layer 31. A side portion 56a of the second diffusion layer 56 may be disposed at an outside of the side portion 41a of the first diffusion layer 41. A side portion 63a of the second resin layer 63 may be disposed at an outside of the side portion 56a of the second diffusion layer 56. The side portion 56a of the second diffusion layer 56 may be disposed between the side portion 41a of the first diffusion layer 41 and the side portion 63a of the second resin layer 63. The side portion 41a of the first diffusion layer 41, the side portion 56a of the second diffusion layer 56 and the side portion 63a of the second resin layer 63 may be in contact with an upper surface of the substrate 11.

Figure 25:
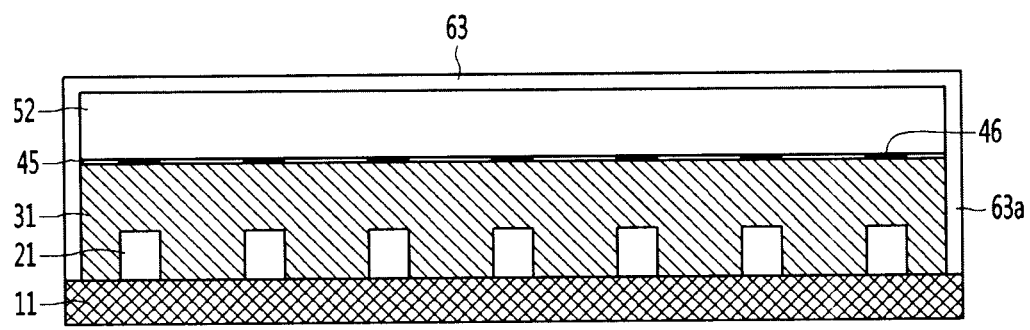
FIG. 25 is an eleventh modified example of the lighting module according to the second embodiment.

FIG. 25 is an eleventh modified example of the lighting module according to the second embodiment.

Referring to FIG. 25, the lighting module may include a substrate 11, a light emitting device 21 disposed on the substrate 11, a first resin layer 31 on the substrate 11, an adhesive layer 45 and a light shielding portion 46 on the first resin layer 31, a first diffusion layer 52 on the adhesive layer 45 and the light shielding portion 46, and a second resin layer 63 on the first diffusion layer 52. The configuration of the first diffusion layer 52 and the second resin layer 63 will be described with reference to the description of the second embodiment disclosed above.

The adhesive layer 45 may be adhered between the first resin layer 31 and the first diffusion layer 52. The adhesive layer 45 may be the same material as that of the first resin layer 31 and the first diffusion layer 52 or may be formed of a different material. The adhesive layer 45 may be a resin material such as silicone or epoxy. The adhesive layer 45 may be disposed at a circumference of the light shielding portion 46 or may be extended to a lower surface of the light shielding portion 46. The light shielding portion 46 may be disposed at a lower surface of the first diffusion layer 41 at a region corresponding to the light emitting device 21. The light shielding portion 46 may be in a range of 50% or more, for example, 50% to 120% of the upper surface area of the light emitting device 21 on the light emitting device 21. The light shielding portion 46 may be formed through a region in which a white material is printed. The light shielding portion 46 may be printed by using, for example, a reflection ink including any one of $Al_2O_3$, $CaCO$, $BaSO_4$, and silicon. The light shielding portion 46 may reflect light emitted via the light exit surface of the light emitting device 21 to reduce the occurrence of hot spots due to the luminous intensity of light on the light emitting device 21. The light shielding portion 46 may print a light shielding pattern by using light shielding ink. The light shielding portion 46 may be formed to be printed at a lower surface of the first diffusion layer 52. The light shielding portion 46 may not shield 100% of incident light, but transmittance may be lower than reflectance, so that the light shielding portion 46 may perform a function of shielding and diffusing the light. The light shielding portion 46 may be formed as a single layer or multiple layers, and may have the same pattern shape or different pattern shapes.

The second resin layer 63 may include the above-described side portion 63a to cover side surfaces of the first resin layer 31 and the first diffusion layer 52. As another example, the side portion 63a may be formed by being extended by the first diffusion layer 52. As another example, although an example in which the side portion 63a of the second resin layer 63 is in contact with an upper surface of the substrate 11 has been described, the side portion 63a may be in contact with an upper surface of any one of the first resin layer 31 and the first diffusion layer 52. As another example, the side portion 63a of the second resin layer 63 may be in contact with at least one of the upper surfaces of the first resin layer 31 and the first diffusion layer 52 and the upper surface of the substrate 11. In this case, the outer circumferences of the first resin layer 31 and the first diffusion layer 52 may be provided in a concave-convex pattern or a stepped structure.

Figure 26:
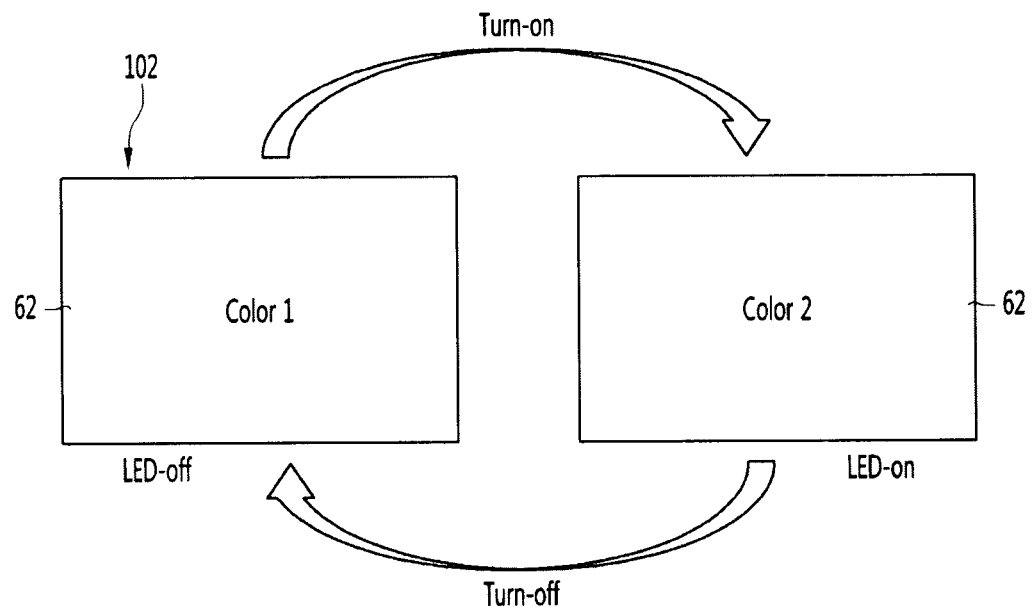
FIG. 26 is a view for explaining an example of change in surface color according to turn-on and turn-off of a light emitting device in a resin layer having ink particles according to the second embodiment.

Referring to FIG. 26, the lighting module of FIGS. 15 and 16 according to an embodiment of the invention may be turned on or off. In the light emitting device 21, for example, it is possible to reduce the difference in color tone between the surface color (Color 1) of the first diffusion layer or the second resin layer, which is the uppermost layer in the off state of an LED and the surface color (Color 2) of the first diffusion layer or the second resin layer, which is the uppermost layer in the LED on state.

In the lighting module of an embodiment, the first resin layer may be disposed on the substrate 11 and/or the second resin layer may be disposed on the first diffusion layer. The embodiment may provide a flexible lighting module having a plurality of resin layers on the substrate 11. The lighting module of an embodiment allow light to be guided in a radial or linear direction in the first resin layer 31 to diffuse and to be wavelength-converted by the phosphor of the first diffusion layer 41, and the difference in color tone of the surface color may be improved via the ink particles of the second resin layer. Accordingly, the light to be finally emitted via the lighting module is emitted as the surface light source. In addition, the plurality of light emitting devices 21 in the lighting module 100 may emit light at five surfaces thereof on the flexible substrate in a flip manner, and the light emitted via the upper surface and the side surface of the light emitting device 21 may be emitted in upper surface and side directions. Electrodes at a lower portion of the light emitting device 21 may face the substrate 11.

The light emitted from the light emitting device 21 may emit light in directions of an upper surface and all side surfaces of the lighting module. The above-described lighting module may be applied to a lamp of a vehicle, a display device having a micro LED, or various lighting apparatuses.

The above-described lighting module provides a surface light source, so that an additional inner lens may be removed, and an air gap on the light emitting device 21 or a structure for inserting the light emitting device 21 may be removed by sealing the light emitting devices 21 with the first resin layer 31.

The lighting module 100 may be provided in a flat plate shape, a convex curved shape, a concave curved shape, or a convex-concave shape when viewed from the side. The lighting module may be a bar shape like a stripe, a polygonal shape, a circular shape, an elliptical shape, a shape having a convex side surface, or a shape having a concave side surface when viewed from the top view.

Figure 32:
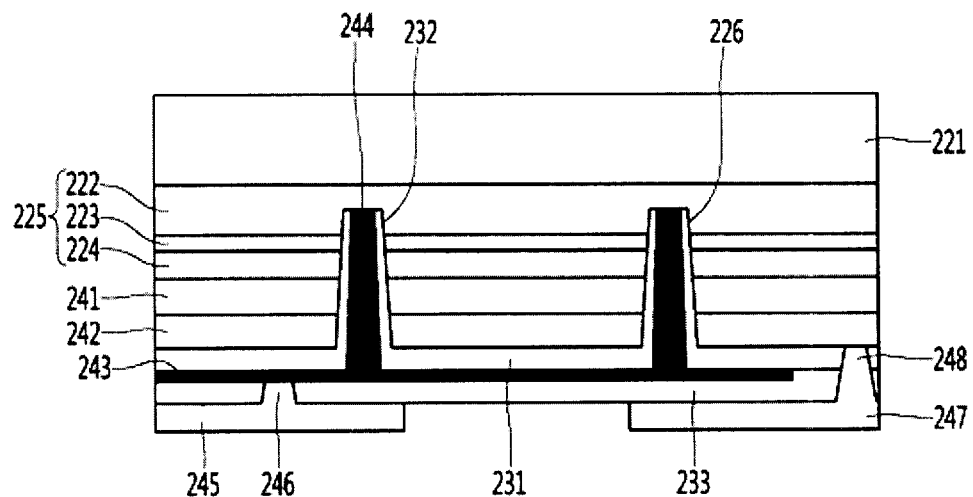
FIG. 32 is an example of a light emitting device in a lighting module according to an embodiment of the invention.

FIG. 32 is a view illustrating an example of a light emitting device of a lighting module according to an embodiment.

Referring to FIG. 32, the light emitting device includes a light emitting structure 225 and a plurality of electrodes 245 and 247. The light emitting structure 225 may be formed with a compound semiconductor layer of elements of Groups II to VI, e.g. a compound semiconductor layer of Group III-V elements or a compound semiconductor layer of Group II-VI elements. The plurality of electrodes 245 and 247 are selectively connected to the semiconductor layer of the light emitting structure 225 to supply power.

The light emitting device may include a light transmitting substrate 221. The light transmitting substrate 221 is disposed on the light emitting structure 225. The light transmitting substrate 221 may be, for example, a light transmittable, insulating substrate, or a conductive substrate. For example, the light transmitting substrate 221 may use at least one of sapphire ($Al_2O_3$), SiC, Si, GaAs, GaN, ZnO, Si, GaP, InP, Ge, and $Ga_2O_3$. A plurality of convex portions (not shown) may be formed on at least one or all of a top surface and a bottom surface of the light transmitting substrate 221 to improve light extraction efficiency. A side cross-sectional view of each convex portion may include at least one of a hemispherical shape, a half-oval shape, or a polygonal shape. The light transmitting substrate 221 may be removed, but is not limited thereto.

At least one of a buffer layer (not shown) and a lower conductive semiconductor layer (not shown) may be included between the light transmitting substrate 221 and the light emitting structure 225. The buffer layer is a layer for mitigating a difference in lattice constant between the light transmitting substrate 221 and the semiconductor layer, and may be selectively formed of compound semiconductors of Groups II to VI. An undoped compound semiconductor layer of Group III-V may be further formed under the buffer layer, but is not limited thereto.

The light emitting structure 225 may be disposed under the light transmitting substrate 221 and include a first conductivity type semiconductor layer 222, an active layer 223, and a second conductivity type semiconductor layer 224. Other semiconductor layers may be further disposed at least one of on and under each of the layers 222, 223, and 224, but is not limited thereto.

The first conductivity type semiconductor layer 222 may be disposed under the light transmitting substrate 221, and be implemented as a semiconductor to which a first conductivity type dopant is doped, for example, an n-type semiconductor layer. The first conductivity type semiconductor layer 222 includes the empirical formula of $In_xAl_yGa_{1-x-y}N$ ($0 \geq x \geq 1$, $0 \geq y \geq 1$, $0 \geq x+y \geq 1$). A material of the first conductivity type semiconductor layer 222 may be selected from compound semiconductors of Group III-V elements such as GaN, AlN, AlGaN, InGaN, InN, InAlGaN, AlInN, AlGaAs, GaP, GaAs, GaAsP, and AlGaInP. The first conductivity type dopant is an n-type dopant, which includes dopants such as Si, Ge, Sn, Se, and Te. The active layer 223 is disposed under the first conductivity type semiconductor layer 222, selectively includes a single quantum well, a multiple quantum well (MQW), a quantum wire structure, or a quantum dot structure, and includes periods of a well layer and a barrier layer. The periods of the well layer/barrier layer include, for example, at least one among pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs. The second conductivity type semiconductor layer 224 is disposed under the active layer 223. The second conductivity type semiconductor layer 224 includes a semiconductor to which a second conductivity type dopant is doped, for example, the empirical formula of $In_xAl_yGa_{1-x-y}N$ ($0 \geq x \geq 1$, $0 \geq y \geq 1$, $0 \geq x+y \geq 1$). The second conductivity type semiconductor layer 224 may be formed of at least one compound semiconductor of GaN, InN, AlN, InGaN, AlGaN, InAlGaN, AlInN, AlGaAs, GaP, GaAs, GaAsP, and AlGaInP. The second conductivity type semiconductor layer 224 is a p-type semiconductor layer, and the first conductivity type dopant is a p-type dopant, which may include Mg, Zn, Ca, Sr, and Ba.

As another example, in the light emitting structure 225, the first conductivity type semiconductor layer 222 may be implemented as a p-type semiconductor layer, and the second conductivity type semiconductor layer 224 may be implemented as an n-type semiconductor layer. A third conductivity type semiconductor layer having opposite polarity from the second conductivity type semiconductor layer 224 may be formed under the second conductivity type semiconductor layer 224. Also, the light emitting structure 225 may be implemented as any one structure among an n-p junction structure, a p-n junction structure, an n-p-n junction structure, and a p-n-p junction structure.

First and second electrodes 245 and 247 are disposed under the light emitting structure 225. The first electrode 245 is electrically connected to the first conductivity type semiconductor layer 222, and the second electrode 247 is electrically connected to the second conductivity type semiconductor layer 224. The first and second electrodes 245 and 247 may have a polygonal or circular bottom shape. The light emitting structure 225 may include a plurality of recesses 226 therein.

The light emitting device includes first and second electrode layers 241 and 242, a third electrode layer 243, and insulating layers 231 and 233. Each of the first and second electrode layers 241 and 242 may be formed as a single layer or multiple layers, and may function as a current spreading layer. The first and second electrode layers 241 and 242 may include a first electrode layer 241 disposed under the light emitting structure 225 and a second electrode layer 242 disposed under the first electrode layer 241. The first electrode layer 241 diffuses a current such that the second electrode layer 242 reflects incident light.

The first and second electrode layers 241 and 242 may be formed with different materials. The first electrode layer 241 may be formed of a light transmittable material, for example, a metal oxide or a metal nitride. The first electrode layer 241 may be selectively formed from indium tin oxide (ITO), ITO nitride (ITON), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO). The second electrode layer 242 may come in contact with a lower surface of the first electrode layer 241 and function as a reflection electrode layer. The second electrode layer 242 includes a metal, for example, Ag, Au, or Al. When a partial region of the first electrode layer 241 is removed, the second electrode layer 242 may partially come in contact with a lower surface of the light emitting structure 225.

As another example, the first and second electrode layers 241 and 242 may be stacked with an omni-directional reflector (ODR) structure. The ODR structure may be formed with a stacked structure of the first electrode layer 241 having a low refractive index and the second electrode layer 242, which is a highly reflective metal material coming in contact with the first electrode layer 241. The electrode layers 241 and 242 may be formed with a stacked structure of ITO/Ag. An omni-directional reflection angle may be improved at an interface between the first electrode layer 241 and the second electrode layer 242.

As another example, the second electrode layer 242 may be removed, and may be formed as a reflection layer of another material. The reflection layer may be formed using a distributed Bragg reflector (DBR) structure. The DBR structure includes a structure in which two dielectric layers having different refractive indexes are alternately disposed, and may include, for example, any different one among a $SiO_2$ layer, a $Si_3N_4$ layer, a $TiO_2$ layer, an $Al_2O_3$ layer, and an MgO layer. As still another example, the electrode layers 241 and 242 may include both the DBR structure and the ODR structure, and in this case, a light emitting device having a light reflection rate of 98% or greater may be provided. Since light reflected from the second electrode layer 242 is emitted via the light transmitting substrate 221 in the light emitting device mounted in the flip method, most light may be emitted vertically upward. The light emitted to the side surface of the light emitting device may be reflected by the reflection member to a light exit region via an adhesive member according to an embodiment.

The third electrode layer 243 is disposed under the second electrode layer 242, and is electrically insulated from the first and second electrode layers 241 and 242. The third electrode layer 243 includes at least one metal of titanium (Ti), copper (Cu), nickel (Ni), gold (Au), chromium (Cr), tantalum (Ta), platinum (Pt), tin (Sn), silver (Ag), and phosphorus (P). The first electrode 245 and the second electrode 247 are disposed under the third electrode layer 243.

The insulating layers 231 and 233 block unnecessary contact between the first and second electrode layers 241 and 242, the third electrode layer 243, the first and second electrodes 245 and 247, and the light emitting structure 225. The insulating layers 231 and 233 include first and second insulating layers 231 and 233 and the first insulating layer 231 is disposed between the third electrode layer 243 and the second electrode layer 242. The second insulating layer 233 is disposed between the third electrode layer 243 and the first and second electrodes 245 and 247.

The third electrode layer 243 is connected to the first conductivity type semiconductor layer 222. A connection portion 244 of the third electrode layer 243 may protrude in a via structure via the first and second electrode layers 241 and 242 and the lower portion of the light emitting structure 225, and may come in contact with the first conductivity type semiconductor layer 222. The connection portion 244 may be disposed in plural. A part 232 of the first insulating layer 231 extends along the recess 226 of the light emitting structure 225 at a circumference of the connection portion 244 of the third electrode layer 243 to block electrical connections between the third electrode layer 243 and the first and second electrode layers 241 and 242, and the second conductivity type semiconductor layer 224 and the active layer 223. An insulating layer may be disposed at a side surface of the light emitting structure 225 for side surface protection, but is not limited thereto.

The second electrode 247 is disposed under the second insulating layer 233, and comes in contact with or is connected to at least one of the first and second electrode layers 241 and 242 via an open region of the second insulating layer 233. The first electrode 245 is disposed under the second insulating layer 233 and connected to the third electrode layer 243 via the open region of the second insulating layer 233. Accordingly, a protrusion 248 of the second electrode 247 is electrically connected to the second conductivity type semiconductor layer 224 via the first and second electrode layers 241 and 242, and a protrusion 246 of the first electrode 245 is electrically connected to the first conductivity type semiconductor layer 222 via the third electrode layer 243. The electrodes 245 and 247 below the light emitting device may face the substrate.

Figure 39:
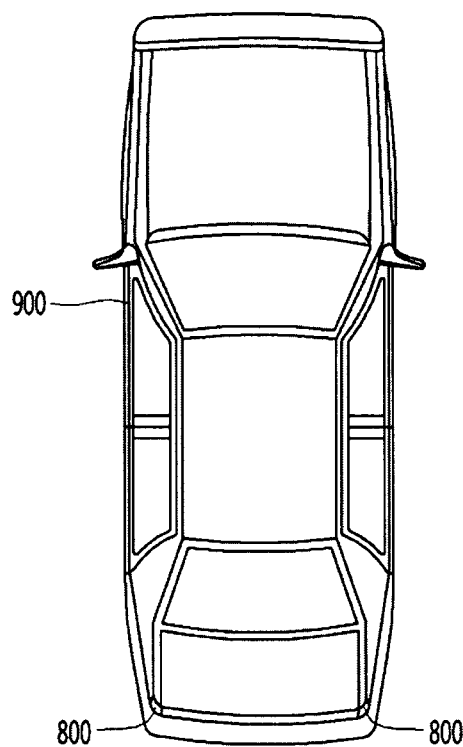
FIG. 39 is a plan view of a vehicle to which a lamp having a lighting module according to an embodiment is applied.
Figure 39:
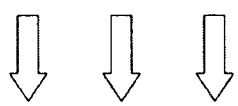
Figure 40:
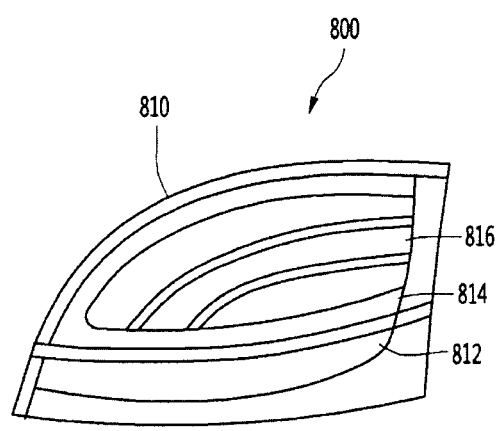
FIG. 40 is a view of a lamp having a lighting module or a lighting apparatus according to an embodiment.

FIG. 39 is a plan view of a vehicle to which a lamp of a vehicle to which the lighting module according to the embodiment is applied is applied, and FIG. 40 is a view illustrating a vehicle lamp having the lighting module or the lighting apparatus disclosed in an embodiment.

Referring to FIGS. 39 and 40, a taillight 800 in a vehicle 900 may include a first lamp unit 812, a second lamp unit 814, a third lamp unit 816, and a housing 810. Here, the first lamp unit 812 may be a light source serving as a turn signal lamp, the second lamp unit 814 may be a light source serving as a side marker lamp, and the third lamp unit 816 may be a light source serving as a stop lamp, but is not limited thereto. At least one or all of the first to third lamp units 812, 814, and 816 may include the lighting module disclosed in an embodiment. The housing 810 accommodates the first to third lamp units 812, 814, and 816, and may be made of a light transmitting material. At this point, the housing 810 may have a curve according to a design of a vehicle body, and the first to third lamp units 812, 814, and 816 may have a curved surface light source according to a shape of the housing 810. Such a vehicle lamp may be applied to a turn signal lamp of a vehicle when the lamp unit is applied to a tail lamp, a stop lamp, or a turn signal lamp of a vehicle.

According to an embodiment of the invention, it is possible to improve the light uniformity of a surface light source in a lighting module.

According to an embodiment of the invention, it is possible to improve the uniformity of a surface light source by guiding, diffusing, and emitting light in a lighting module.

According to an embodiment of the invention, it is possible to improve the uniformity of wavelength-converted light by allowing light diffused in a lighting module to be wavelength-converted to a phosphor.

According to an embodiment of the invention, it is possible to reduce hot spots on each light emitting device in a lighting module.

According to the embodiment of the invention, there is an effect that it is possible to realize an image with a color of a phosphor film at the time of lighting by providing a colored phosphor film on a lighting module.

According to an embodiment of the invention, a flexible lighting module can be realized by stacking a plurality of diffusion layers of a resin material, Embodiments of the invention can improve the light efficiency and backlighting characteristics of a lighting module.

Embodiments of the invention can reduce the difference in chromaticity between an appearance image and a light emission image of a resin layer of a lighting module.

Embodiments of the invention can reduce an amount of a phosphor by arranging ink particles having the same color as a light emission color of a phosphor in the upper most layer of a lighting module.

Embodiments of the invention can improve an unlighted color of a lighting module.

Embodiments of the invention can improve the optical reliability of a lighting module and a lighting apparatus having the same.

Embodiments of the invention can improve the reliability of a vehicle lighting apparatus having a lighting module.

Embodiments of the invention can be applied to a backlight unit, various display devices, a surface light source illumination device, or a vehicle lamp having a lighting module.

The characteristics, structures and effects described in the above-described embodiments are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modified example are included in the scope of the invention.

In addition, embodiments are mostly described above. However, they are only examples and do not limit the invention. A person skilled in the art may appreciate that several variations and applications not presented above may be made without departing from the essential characteristics of the embodiments. For example, each component particularly represented in the embodiments may be varied. In addition, it should be construed that differences related to such a variation and such an application are included in the scope of the invention defined in the following claims.

What is claimed is:

1. A lighting module comprising:
  a substrate;
  a plurality of light emitting devices disposed on the substrate and emitting blue light;
  a first resin layer disposed on the substrate and sealing the plurality of light emitting devices;
  a first diffusion layer disposed directly on the first resin layer and including a phosphor and a diffusing agent; and
  a second resin layer disposed directly on the first diffusion layer and including ink particles,
  wherein the first resin layer is disposed on upper surfaces and side surfaces of the plurality of light emitting devices,
  wherein a content of the phosphor included in the first diffusion layer is in a range of 10 wt % to 23 wt % in resin material of the first diffusion layer, and a content of the diffusing agent is less than 3 wt % in resin material of the first diffusion layer, and
  wherein a color of the ink particles corresponds to a color of wavelength-converted light outputted by the phosphor in the first diffusion layer, and the ink particles in the second resin layer block incident light.

2. The lighting module of claim 1, wherein an interval between the plurality of light emitting devices is greater than or equal to a thickness of the first resin layer,
  wherein the thickness of the first resin layer is greater than a thickness of the substrate, and
  wherein the thickness of the first resin layer is a height from a lower surface of the first resin layer to an upper surface of the first resin layer.

3. The lighting module of claim 2, wherein the thickness of the first resin layer is greater than a thickness of the first diffusion layer, and
  wherein the thickness of the first diffusion layer is a height from a lower surface of the first diffusion layer to an upper surface of the first diffusion layer disposed on the upper surface of the first resin layer.

4. The lighting module of claim 3, wherein light emitted to an outside through the first diffusion layer has a light uniformity of 90% or more.

5. The lighting module of claim 3, wherein the first diffusion layer emits a red light.

6. The lighting module of claim 5, wherein the first resin layer and the first diffusion layer are formed of a same resin material, and
  wherein the first resin layer is formed in a layer without a diffusing agent.

7. The lighting module of claim 6, wherein the first diffusion layer includes an upper portion covering the upper surface of the first resin layer and a side portion extending from the upper portion toward the substrate and covering side surfaces of the first resin layer, and
  wherein the second resin layer includes an upper portion covering an upper surface of the first diffusion layer and a side portion extending from the upper portion of the second resin layer toward the substrate and covering side surfaces of the first diffusion layer.

8. The lighting module of claim 3, wherein the thickness of the first resin layer is in a range of 2.7 mm or less,
  wherein each of the plurality of light emitting devices emits a wavelength in a range of 420 nm to 470 nm,
  wherein a straight distance between a lower surface of the substrate and the upper surface of the first diffusion layer is 220% or less of the thickness of the first resin layer, and
  wherein the thickness of the first diffusion layer is in a range of 40% to 80% of the thickness of the first resin layer.

9. The lighting module of claim 1, wherein each of the plurality of light emitting devices includes:
  a light transmitting substrate;
  a light emitting structure having a first conductivity type semiconductor layer, an active layer and a second conductivity type semiconductor layer and disposed under the light transmitting substrate;
  a first electrode connected to the first conductivity type semiconductor layer and disposed under the light emitting structure; and a second electrode connected to the second conductivity type semiconductor layer and disposed under the light emitting structure, wherein the first electrode and the second electrode are connected to the substrate in a flip chip type.

10. The lighting module of claim 1, wherein the diffusing agent has a refractive index ranging from 1.4 to 2.

11. The lighting module of claim 3, wherein the thickness of the first resin layer is in a range of 2.7 mm or less, and wherein the lighting module is provided with a thickness of 5.5 mm or less.

12. The lighting module of claim 1, wherein the first diffusion layer includes ink particles, and wherein the phosphor emits a red light and the ink particles has a red color.

13. The lighting module of claim 12, wherein a side portion of the first diffusion layer contacts the substrate and includes the phosphor and the ink particles.

14. The lighting module of claim 1, comprising a light shielding portion disposed between the first resin layer and the first diffusion layer and vertically overlapped with each of the plurality of light emitting devices, a total area of the light shielding portion being 50% to 120% of a total upper surface area of the light emitting devices.

15. The lighting module of claim 1, wherein a content of the ink particles included in the second resin layer is 12 wt % or less in resin material of the second resin layer.

16. A lighting module comprising:

a substrate;

a plurality of light emitting devices disposed on the substrate and emitting a wavelength in a range of 420 nm to 470 nm;

a first resin layer disposed on the substrate and the plurality of the light emitting devices; and a first diffusion layer disposed directly on the first resin layer and including a phosphor and ink particles, wherein a content of the phosphor included in the first diffusion layer is in a range of 10 wt % to 23 wt % in resin material of the first diffusion layer, and a content of the ink particles in the first diffusion layer is at least 3 wt % less than the content of the phosphor in the first diffusion layer, wherein the lighting module is provided with a thickness of 5.5 mm or less and emits a red light, wherein ink particles include at least one of metal ink, ultraviolet (UV) ink, or curing ink, wherein a color of the ink particles corresponds to a color of wavelength-converted light outputted by the phosphor, wherein the ink particles in the first diffusion layer block incident light, wherein the first diffusion layer includes an upper portion covering an upper surface of first resin layer and a side portion extending from the upper portion toward the substrate and covering side surfaces of the first resin layer, and wherein the upper portion and the side portion of the first diffusion layer includes the phosphor and the ink particles.

17. The lighting module of claim 16, comprising a second resin layer disposed directly on the first diffusion layer and including ink particles, wherein a content of the ink particles included in the second resin layer is 12 wt % or less in resin material of the second resin layer, wherein the phosphor and the ink particles have a red color, and wherein the second resin layer has a thickness smaller than a thickness of the first diffusion layer.

18. The lighting module of claim 16, wherein the plurality of light emitting devices is arranged in N columns and M rows, wherein N and M are integers of 2 or more, and wherein each of the plurality of light emitting devices includes a first electrode and a second electrode electrically connected to the substrate and facing an upper surface of the substrate.

19. The lighting module of claim 18, wherein an interval between the plurality of light emitting devices is greater than or equal to a thickness of the first resin layer, wherein the thickness of the first resin layer is in a range of 5 times or more a thickness of the substrate, wherein the thickness of the first resin layer than a thickness of the first diffusion layer, and wherein the thickness of the first resin layer is in a range of 2 mm to 2.7 mm.

20. The lighting module of claim 17, wherein the second resin layer includes an upper portion covering an upper surface of the first diffusion layer and a side portion extending from the upper portion toward the substrate and covering side surfaces of the first diffusion layer, and wherein the upper portion and the side portion of the second resin layer includes the red ink particles having red color.

* * * * *